US010283518B2

(12) United States Patent
Lee et al.

(10) Patent No.: US 10,283,518 B2
(45) Date of Patent: May 7, 2019

(54) SEMICONDUCTOR DEVICE AND METHOD OF MANUFACTURING THE SAME

(71) Applicant: SK hynix Inc., Gyeonggi-do (KR)

(72) Inventors: Ki Hong Lee, Gyeonggi-do (KR); Seung Ho Pyi, Gyeonggi-do (KR); Seung Jun Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 596 days.

(21) Appl. No.: 14/282,898

(22) Filed: May 20, 2014

(65) Prior Publication Data

US 2015/0162342 A1   Jun. 11, 2015

(30) Foreign Application Priority Data

Dec. 9, 2013  (KR) .......................... 10-2013-0152591

(51) Int. Cl.
| | |
|---|---|
| *H01L 27/115* | (2017.01) |
| *H01L 29/66* | (2006.01) |
| *H01L 29/792* | (2006.01) |
| *H01L 27/11582* | (2017.01) |
| *H01L 27/11573* | (2017.01) |

(52) U.S. Cl.
CPC .. *H01L 27/11582* (2013.01); *H01L 27/11573* (2013.01); *H01L 29/66666* (2013.01); *H01L 29/66833* (2013.01); *H01L 29/7926* (2013.01)

(58) Field of Classification Search
CPC ......... H01L 27/11573; H01L 27/11582; H01L 29/66666; H01L 29/66833; H01L 29/7926
See application file for complete search history.

(56) References Cited

U.S. PATENT DOCUMENTS

| | | | |
|---|---|---|---|
| 2010/0109065 A1 | 5/2010 | Oh et al. | |
| 2011/0001182 A1* | 1/2011 | Sato | H01L 27/0207 257/324 |
| 2011/0291176 A1* | 12/2011 | Lee | H01L 27/11578 257/324 |
| 2012/0112264 A1* | 5/2012 | Lee | H01L 27/11551 257/324 |
| 2012/0146127 A1* | 6/2012 | Lee | H01L 21/28282 257/324 |
| 2012/0280298 A1* | 11/2012 | Park | H01L 29/7926 257/314 |
| 2013/0187118 A1* | 7/2013 | Murooka | H01L 45/04 257/4 |

FOREIGN PATENT DOCUMENTS

| | | |
|---|---|---|
| CN | 102468280 | 5/2012 |
| KR | 101263182 | 5/2013 |
| KR | 1020140048653 | 4/2014 |

OTHER PUBLICATIONS

Office Action issued by the State Intellectual Property Office dated Aug. 29, 2018.

* cited by examiner

*Primary Examiner* — Tom Thomas
*Assistant Examiner* — Benjamin T Liu
(74) *Attorney, Agent, or Firm* — IP & T Group LLP

(57) ABSTRACT

A semiconductor device includes a first stacked structure having first conductive layers and first insulating layers formed alternately with each other, first semiconductor patterns passing through the first stacked structure, a coupling pattern coupled to the first semiconductor patterns, and a slit passing through the first stacked structure and the coupling pattern.

35 Claims, 34 Drawing Sheets

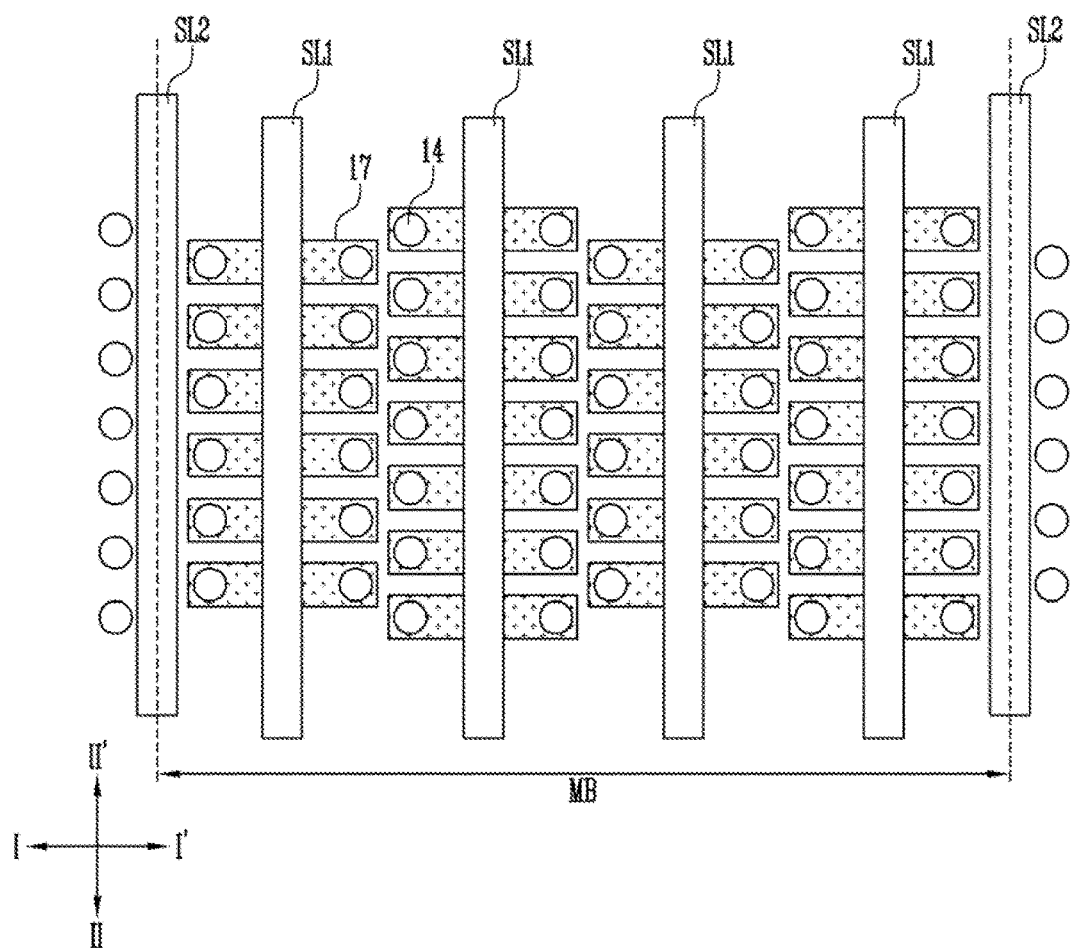

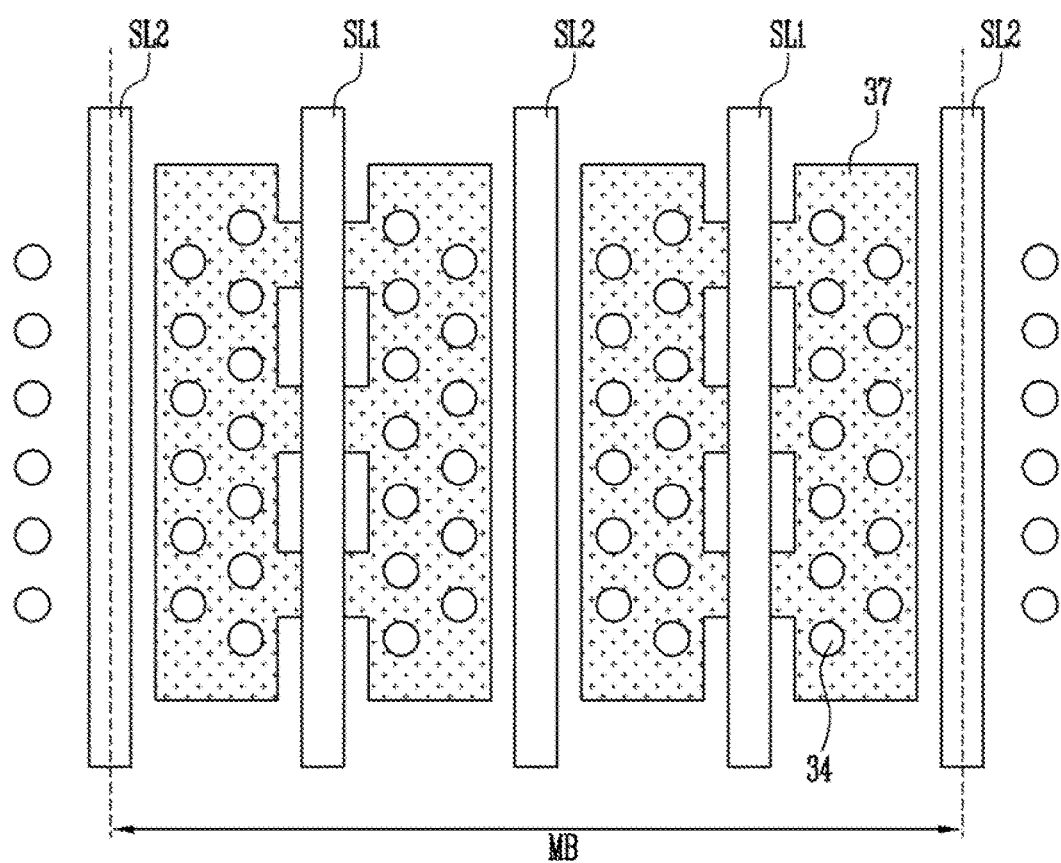

SEMICONDUCTOR DEVICE AND METHOD OF MANUFACTURING THE SAME

CROSS-REFERENCE TO RELATED APPLICATION

The present application claims priority to Korean patent application number 10-2013-0152591, filed on Dec. 9, 2013, the entire disclosure of which is incorporated herein in its entirety by reference.

BACKGROUND

1. Field of Invention

Various exemplary embodiments of the present invention relate generally to an electronic device and a method of manufacturing the same, and more particularly, to a semiconductor device and a method of manufacturing the same.

2. Description of Related Art

A non-volatile memory device preserves stored data even when power is cut off. Two-dimensional memory devices in which memory cells are fabricated in a single layer over a silicon substrate have reached physical limits in increasing their degree of integration. Accordingly, three-dimensional (3D) non-volatile memory devices in which memory cells are stacked in a vertical direction over a silicon substrate have been proposed.

In a conventional 3D non-volatile memory, a stacked structure may be formed by alternately stacking conductive layers and insulating layers, and by forming a channel layer passing through the stacked structure, so that a plurality of memory cells may be formed at the same time. However, as the height of the stacked structure increases, the manufacturing process increases in difficulty. In addition, increases in channel length may lead to a reduction in cell current.

SUMMARY

Exemplary embodiments of the present invention are directed to a semiconductor device having improved characteristics and a method of manufacturing the same.

A semiconductor device according to an embodiment of the present invention may include a first stacked structure having first conductive layers and first insulating layers formed alternately with each other, first semiconductor patterns passing through the first stacked structure, a coupling pattern coupled to the first semiconductor patterns, and a slit passing through the first stacked structure and the coupling pattern.

A semiconductor device according to an embodiment of the present invention may include a first stacked structure having first gate electrodes and first insulating layers formed alternately with each other, a second stacked structure located under the first stacked structure and including second gate electrodes and second insulating layers formed alternately with each other, first channel layers passing through the first stacked structure, second channel layers passing through the second stacked structure, a coupling pattern including a horizontal portion coupled to lower portions of the first channel layers and upper portions of the second channel layers and vertical portions protruding from the horizontal portion and surrounding sidewalls of the first channel layers, and a slit passing through the first stacked structure, the second stacked structure and the horizontal portion of the coupling pattern.

A method of manufacturing a semiconductor device according to an embodiment of the present invention may include forming a sacrificial pattern, forming a first stacked structure over the sacrificial pattern, wherein the first stacked structure includes first material layers and second material layers formed alternately with each other, forming first openings passing through the first stacked structure, removing the sacrificial pattern through the first openings to form a second opening, forming a multilayer dielectric layer in the first and second openings to fill the second opening; and forming first semiconductor patterns in the first openings.

BRIEF DESCRIPTION OF THE DRAWINGS

FIG. 2 is a layout view illustrating the semiconductor device described with reference to FIGS. 1A to 1C;

FIGS. 4A to 4D are layout views illustrating the semiconductor device described with reference to FIGS. 3A to 3F;

DETAILED DESCRIPTION

Figure 1A:
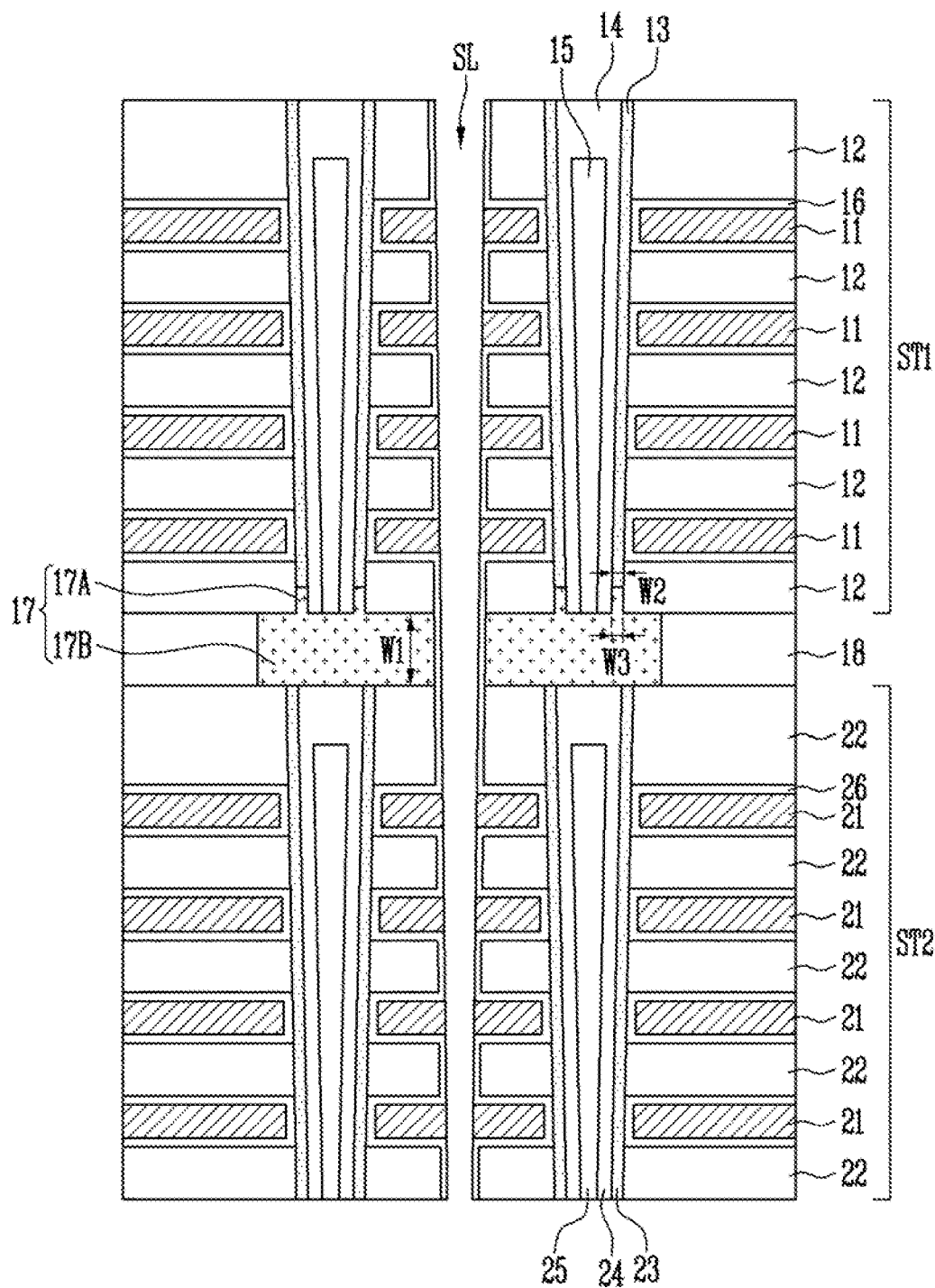
FIGS. 1A to 1C are cross-sectional views illustrating a semiconductor device according to an embodiment of the present invention.

Hereinafter, various embodiments of the present disclosure will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, thicknesses and distance of components are exaggerated for convenience of illustration. In the following description, detailed explanations of known related functions and constitutions may be omitted to avoid unnecessarily obscuring the subject manner of the present invention.

Like reference numerals refer to like elements throughout the specification and drawings.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added. Also, in this specification, a phrase 'substantially the same' may be used to cover a difference or a discrepancy within an allowable error.

It should be readily understood that the meaning of "on" and "over" in the present disclosure should be interpreted in the broadest manner so that "on" means not only "directly on" but also "on" something with an intermediate feature(s) or a layer(s) therebetween, and that "over" means not only directly on top but also on top of something with an intermediate feature(s) or a layer(s) therebetween.

FIG. 1A is a cross-sectional view illustrating a semiconductor device according to an embodiment of the present invention.

As illustrated in FIG. 1A, the semiconductor device may include a first stacked structure ST1 including first conductive layers 11 and first insulating layers 12 formed alternately with each other, first semiconductor patterns 14 passing through the first stacked structure ST, a coupling pattern 17 coupled to the first semiconductor patterns 14, and a slit SL.

The first conductive layers 11 may be gate electrodes of transistors. For example, the first conductive layers 11 may be gate electrodes of selection transistors, memory cell transistors and the like. The first conductive layers 11 may include a polysilicon layer or tungsten. The first insulating layers 12 may electrically insulate the stacked gate electrodes from each other, and include oxide layers.

The first semiconductor patterns 14 may be channel layers of transistors. For example, the first semiconductor patterns 14 may be channel layers of selection transistors, memory cell transistors and the like. The first semiconductor patterns 14 may include polysilicon layers. Each of the first semiconductor patterns 14 may have a central portion, which may be open or completely filled, wholly or in part. Insulating layers 15 may be formed in the open central portions of the first semiconductor patterns 14.

The coupling pattern 17 may be coupled to lower portions of the first semiconductor patterns 14. The coupling pattern 17 may include a horizontal portion 17B coupled to the lower portion of the first semiconductor pattern 14 and vertical portions 17A protruding from the horizontal portion 17B and surrounding sidewalls of the first semiconductor patterns 14. The vertical portions 17A may protrude from either or both of the top and bottom surfaces of the horizontal portion 17B.

Each of the vertical portions 17A may evenly or unevenly surround each of the sidewalls of the first semiconductor patterns 14 at a uniform or non-uniform height. For example, the coupling pattern 17 may include polysilicon or a silicide material and have conductivity.

The slit SL may be formed between the first semiconductor patterns 14 and pass through the first stacked structure ST1, and the horizontal portion 17B of the coupling pattern 17. Though not illustrated in FIG. 1A, an insulating layer may be formed in the slit SL.

The semiconductor device may further include first multilayer dielectric layers 13 surrounding the sidewalls of the first semiconductor patterns 14. Each of the first multilayer dielectric layers 13 may be a gate insulating layer of a selection transistor or a memory layer of a memory cell transistor. For example, each of the first multilayer dielectric layers 13 may include at least one of a charge blocking layer, a data storage layer and a tunnel insulating layer. The data storage layer may include a charge trap layer such as a nitride layer, a polysilicon layer, nanodots, and a phase-change material layer.

The first multilayer dielectric layer 13 and the vertical portion 17A of the coupling pattern 17 may have substantially the same thickness, i.e., W2=W3. The thickness W1 of the horizontal portion 17B may be less than twice as much as the thickness W2 of the first multilayer dielectric layer 13. For example, when the first multilayer dielectric layer 13 includes the charge blocking layer, the data storage layer and the tunnel insulating layer, the thickness W1 of the horizontal portion 17B of the coupling pattern 17 may be less than twice as much as the sum of thicknesses of the charge blocking layer, the data storage layer and the tunnel insulating layer while more than twice as much as the sum of thicknesses of the charge blocking layer and the data storage layer. In another example, the thickness W1 of the horizontal portion 17B of the coupling pattern 17 may be less than twice as much as the sum of the thicknesses of the charge blocking layer and the data storage layer while more than twice as much as the thickness of the charge blocking layer.

The semiconductor device may further include first dielectric patterns 16 surrounding the first conductive layers 11. For example, each of the first dielectric patterns 16 may include at least one of the charge blocking layer, the data storage layer and the tunnel insulating layer.

The semiconductor device may further include a second stacked structure ST2 located under the first stacked structure ST1. The second stacked structure ST2 may be similar to the first stacked structure ST1. For example, the second stacked structure ST2 may include second conductive layers 21 and second insulating layers 22 formed alternately with each other, second semiconductor patterns 24 passing through the second stacked structure ST2, a second multilayer dielectric layer 23 surrounding sidewalls of the second semiconductor patterns 24, and a second dielectric pattern 26 surrounding the second conductive layers 21.

The slit SL may extend to pass through the second stacked structure ST2. The coupling pattern 17 and an insulating layer 18 surrounding the coupling pattern 17 may be interposed between the first stacked structure ST1 and the second stacked structure ST2. The coupling pattern 17 may contact lower portions of the first semiconductor patterns 14 and upper portions of the second semiconductor patterns 24, so that the first semiconductor pattern 14 and the second semiconductor pattern 24 may be coupled to each other through the coupling pattern 17.

For example, when the first and second semiconductor patterns 14 and 24 are channel layers, and the coupling pattern 17 has conductivity, a portion of the channel layer may include a conductive pattern. Therefore, a cell current flowing through the channel layer may be improved. In addition, the channel layer having a high aspect ratio may be formed through a manufacturing process having lowered level of difficulty by using the plurality of semiconductor patterns coupled through the coupling pattern 17.

Though not illustrated in FIG. 1A, each of the second semiconductor patterns 24 may include a groove, and the groove may be filled with the coupling pattern 17. In addition, the semiconductor device may further include another coupling pattern, which may be coupled to the bottom surface of the second semiconductor patterns 24, and may function as a source layer.

In accordance with the embodiment of the present invention, at least one of the uppermost first conductive layers 11 and at least one of the lowermost second conductive layers 21 may be gate electrodes of selection transistors, and the remaining first and second conductive layers 11 and 21 may be gate electrodes of memory cell transistors. In this example, cell strings of the semiconductor device may have vertically linear arrangement.

Figure 1B:
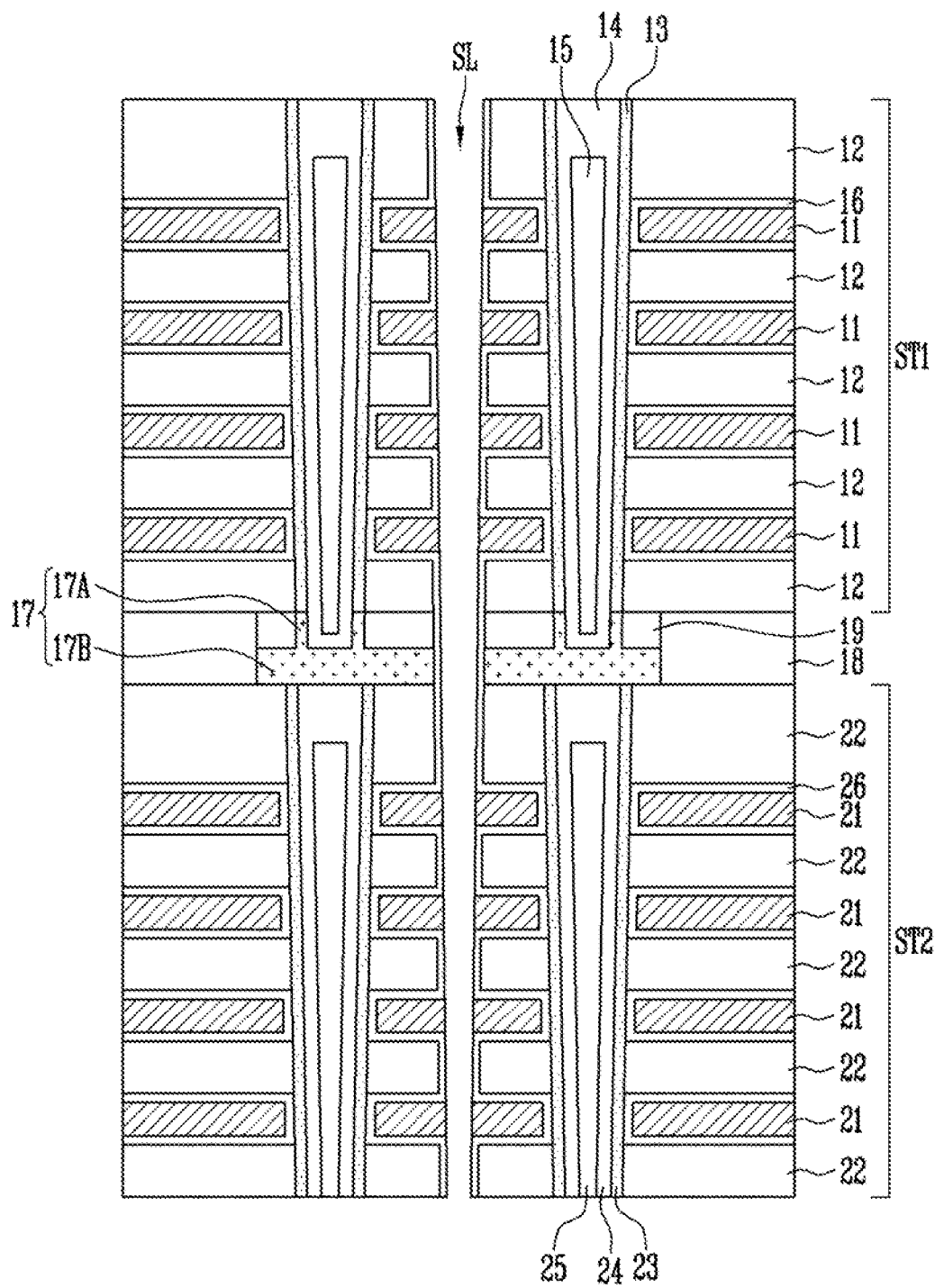

FIG. 1B is a cross-sectional view illustrating a semiconductor device according to an embodiment of the present invention.

As illustrated in FIG. 1B, the semiconductor device may further include a protective layer 19 formed over the coupling pattern 17. The protective layer 19 may contact a top surface of the coupling pattern 17 and include a different material from the coupling pattern 17. For example, the coupling pattern 17 may include a silicide material, and the protective layer 19 may include doped polysilicon, undoped polysilicon or the like. Other than as described herein with reference to FIG. 1B, the semiconductor device may be the same as described above with reference to FIG. 1A.

Figure 1C:
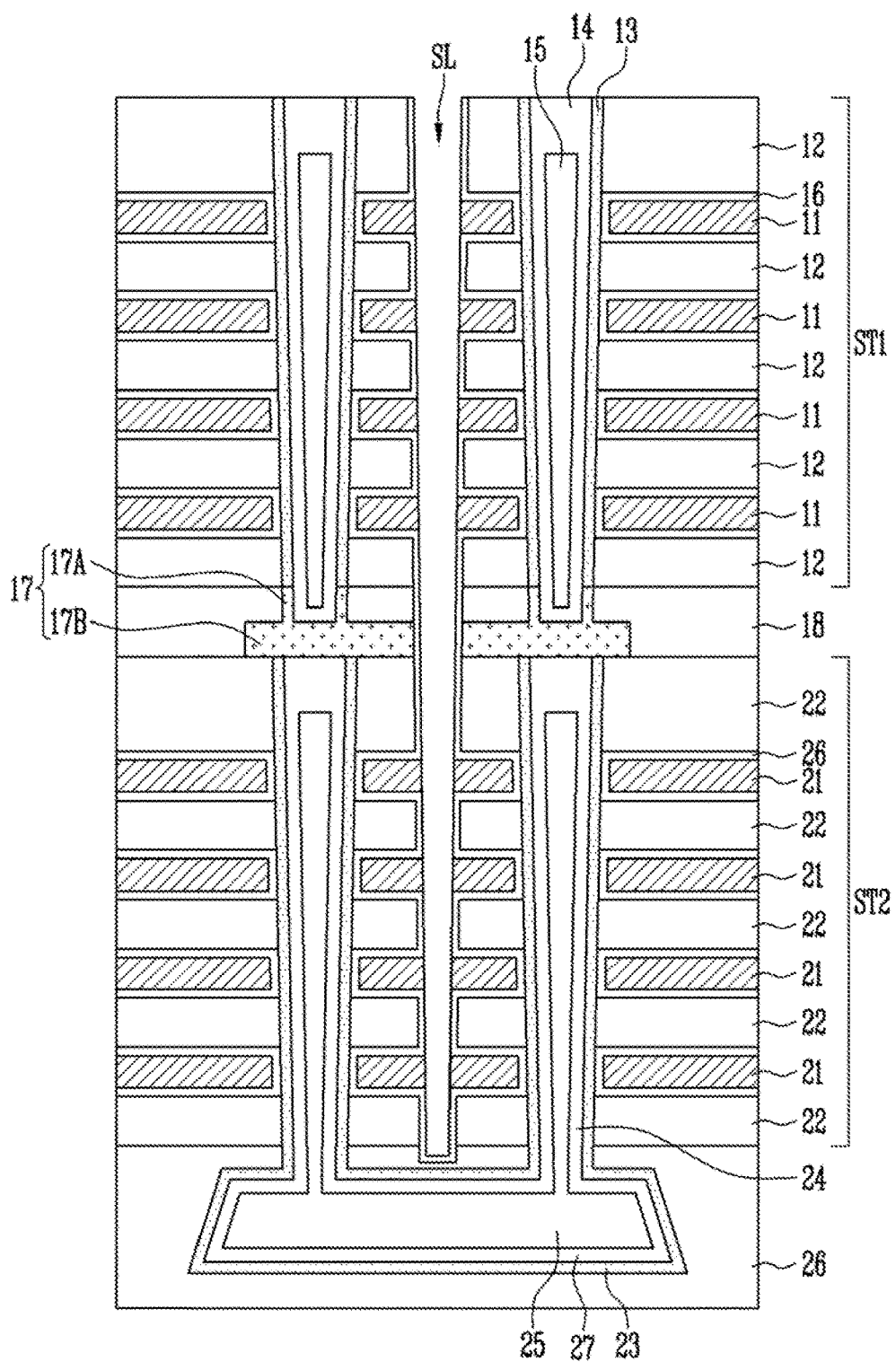

FIG. 1C is a cross-sectional view illustrating a semiconductor device according to an embodiment of the present invention.

As illustrated in FIG. 1C, a semiconductor device may further include a third semiconductor pattern 27 coupling at least two second semiconductor patterns 24, and a third conductive layer 26 surrounding the third semiconductor pattern 27.

The third semiconductor pattern 27 may be connected to the second semiconductor patterns 24 in a single body. The third semiconductor pattern 27 may have a central portion, which may be open or filled, wholly or in part. The open central portion of the third semiconductor pattern 27 may be filled with an insulating layer 25. The second multilayer dielectric layer 23 surrounding the sidewalls of the second semiconductor patterns 24 may extend to surround the third semiconductor pattern 27.

In accordance with the embodiment of the present invention, at least one of the uppermost first conductive layers 11 may be gate electrodes of selection transistors; the remaining first conductive layers 11, and the second conductive layers 21 may be gate electrodes of memory cell transistors; and the third conductive layer 26 may be a gate electrode of a pipe transistor coupling the memory cell transistors. In this example, cell strings of the semiconductor device may have U-shaped arrangement. Other than as described herein with reference to FIG. 1C, the semiconductor device may be the same as described above with reference to FIG. 1A.

FIG. 2 is a layout view illustrating the semiconductor device described with reference to FIGS. 1A to 1C. For the sake of clear illustration, FIG. 2 shows only the positions of the first semiconductor patterns 14, the coupling pattern 17, and slits SL1 and SL2 of the semiconductor device.

As illustrated in FIG. 2, the first semiconductor patterns 14 may be arranged in a first direction I-I' and a second direction II-II' crossing the first direction I-I'. The first semiconductor patterns 14 may be arranged in a matrix pattern or offset from each other.

The coupling patterns 17 may have island shapes, and may be arranged in a matrix pattern or offset from each other. Each of the coupling patterns 17 may overlap each of the first semiconductor patterns 14.

Each of the first slits SL1 may be located between neighboring coupling patterns 17 and extend in the second direction II-II'. Therefore, the coupling patterns 17 may contact the first slits SL1 and be separated by the first slit SL1. The second slits SL2 may be located at boundaries of memory blocks MB of the semiconductor device. The first slits SL1 and the second slits SL2 may be formed at the same time or separately. An insulating layer may be formed in the first and second slits SL1 and SL2.

Figure 3A:
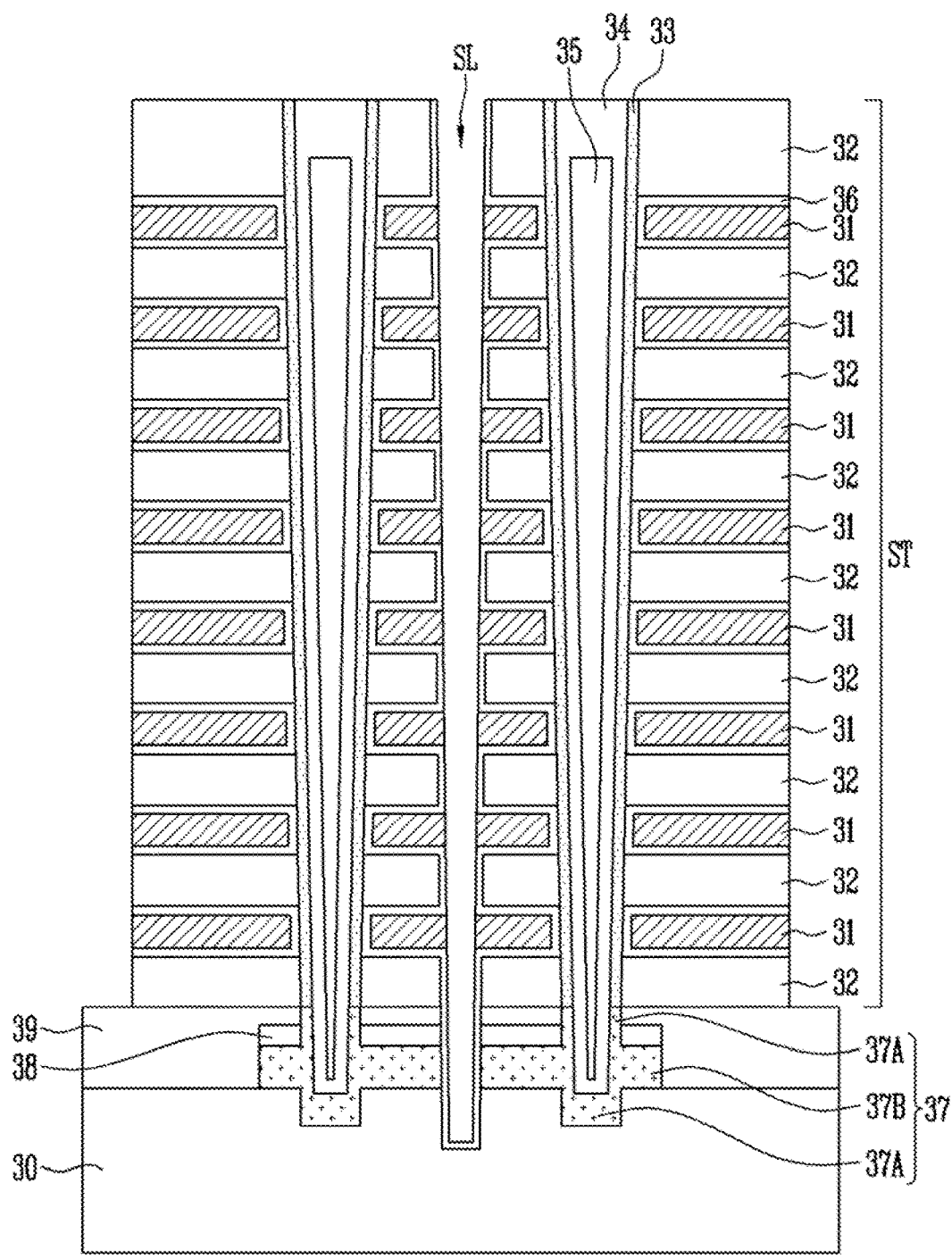
FIGS. 3A to 3F are cross-sectional views illustrating a semiconductor device according to an embodiment of the present invention.

FIG. 3A is a cross-sectional view illustrating a semiconductor device according to an embodiment of the present invention. Hereinafter, description placing focus on features illustrated by the drawing will be made with reference to the drawing.

As illustrated in FIG. 3A, a semiconductor device according to an embodiment of the present invention may include a substrate 30, a stacked structure ST located on the substrate 30 having conductive layers 31 and insulating layers 32 formed alternately with each other, semiconductor patterns 34 passing through the stacked structure ST, a coupling pattern 37 coupled to semiconductor patterns 34, and the slit SL.

The semiconductor patterns 34 may be channel layers of transistors, for example, channel layers of selection transistors and memory cell transistors. Insulating layers 35 may be formed in open central portions of the semiconductor patterns 34.

The coupling pattern 37 may be located between the stacked structure ST and the substrate 30 and be coupled to lower portions of the semiconductor patterns 34. The coupling pattern 37 may include a horizontal portion 37B coupled to the lower portions of the semiconductor patterns 34 and vertical portions 37A protruding from the horizontal portion 37B. The vertical portion 37A may protrude from a top surface and a bottom surface of the horizontal portion 37B. The coupling pattern 37 may contact the substrate 30, and the vertical portion 37A may partially protrude into the substrate 30.

The slit SL may be located between the semiconductor patterns 34 and pass through the stacked structure ST and the horizontal portions 37B of the coupling pattern 37. The slit SL may pass through the substrate 30 to a predetermined depth.

The semiconductor device may further include a protective layer 38 formed over the coupling pattern 37. The protective layer 38 may contact a top surface of the coupling pattern 37 and include a different material from the coupling pattern 37. The semiconductor device may include an insulating layer 39, which surrounds the coupling pattern 37 and the protective layer 38, and is interposed between the substrate 30 and the stacked structure ST. For example, the insulating layer 39 may include an oxide layer. The semiconductor device may further include multilayer dielectric layers 33 surrounding sidewalls of the semiconductor patterns 34, and dielectric patterns 36 surrounding the first conductive layers 31.

In accordance with the embodiment of the present invention, the semiconductor patterns 34 may be channel layers, and the coupling pattern 37 may be a source layer. In such case, source resistance of the memory string may be reduced and a cell current may be improved by forming the source layer with a metal layer such as a silicide layer.

FIGS. 3B to 3E are cross-sectional views illustrating a semiconductor device according to an embodiment of the present invention. In FIGS. 3B to 3E, the coupling pattern 37 may be a first source layer S1. Hereinafter, a description placing focus on features illustrated by the drawings will be made with reference to the drawings.

As illustrated in FIGS. 3B to 3E, the semiconductor device may further include a second source layer 41 surrounding the coupling pattern 37 and an insulating layer 40 interposed between the second source layer 41 and the substrate 30. The second source layer 41 may include a different material from the coupling pattern 37. For example, the coupling pattern 37 may include a metal layer with a silicide material. The second source layer 41 may include polysilicon.

Figure 3B:
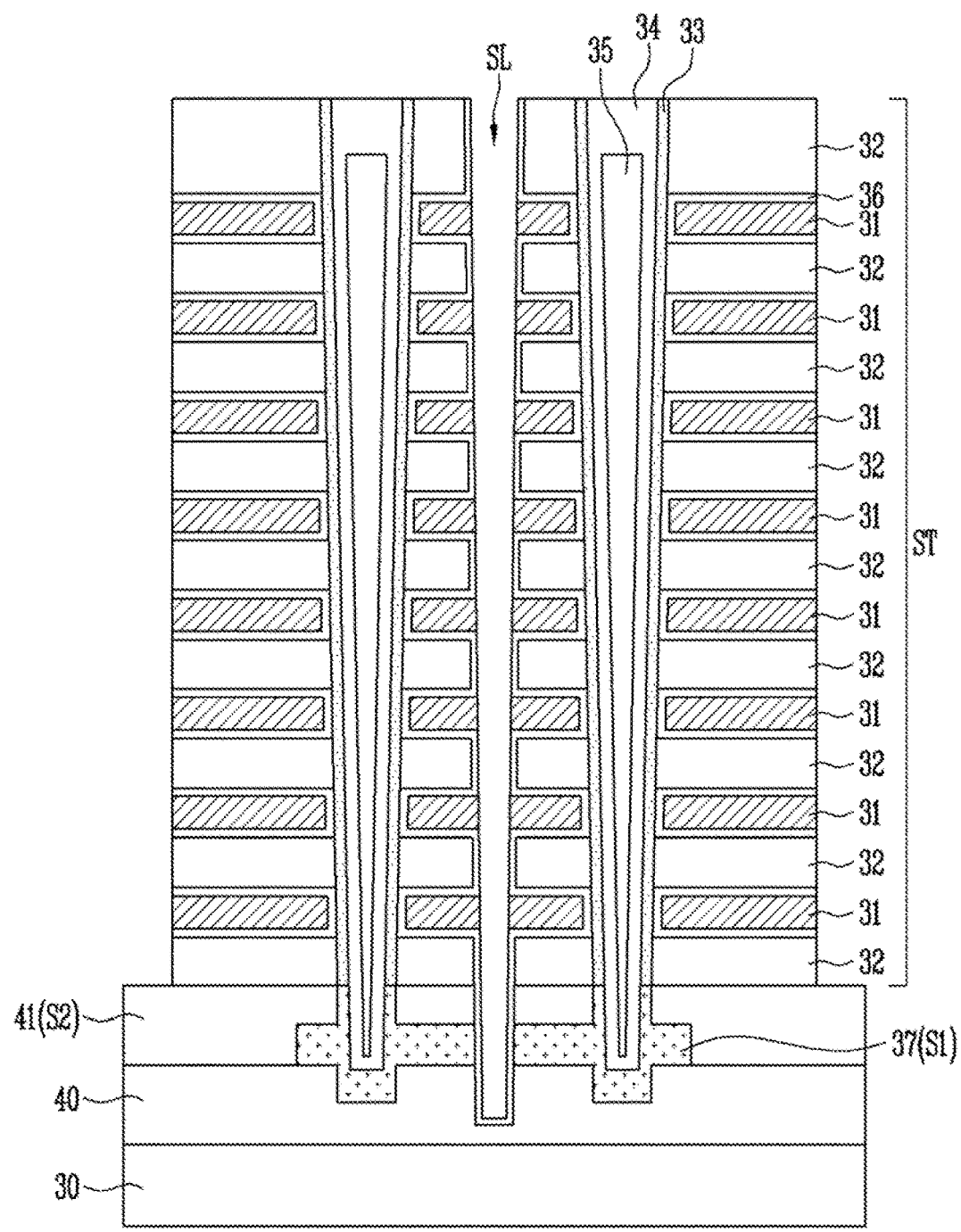
Figure 3C:
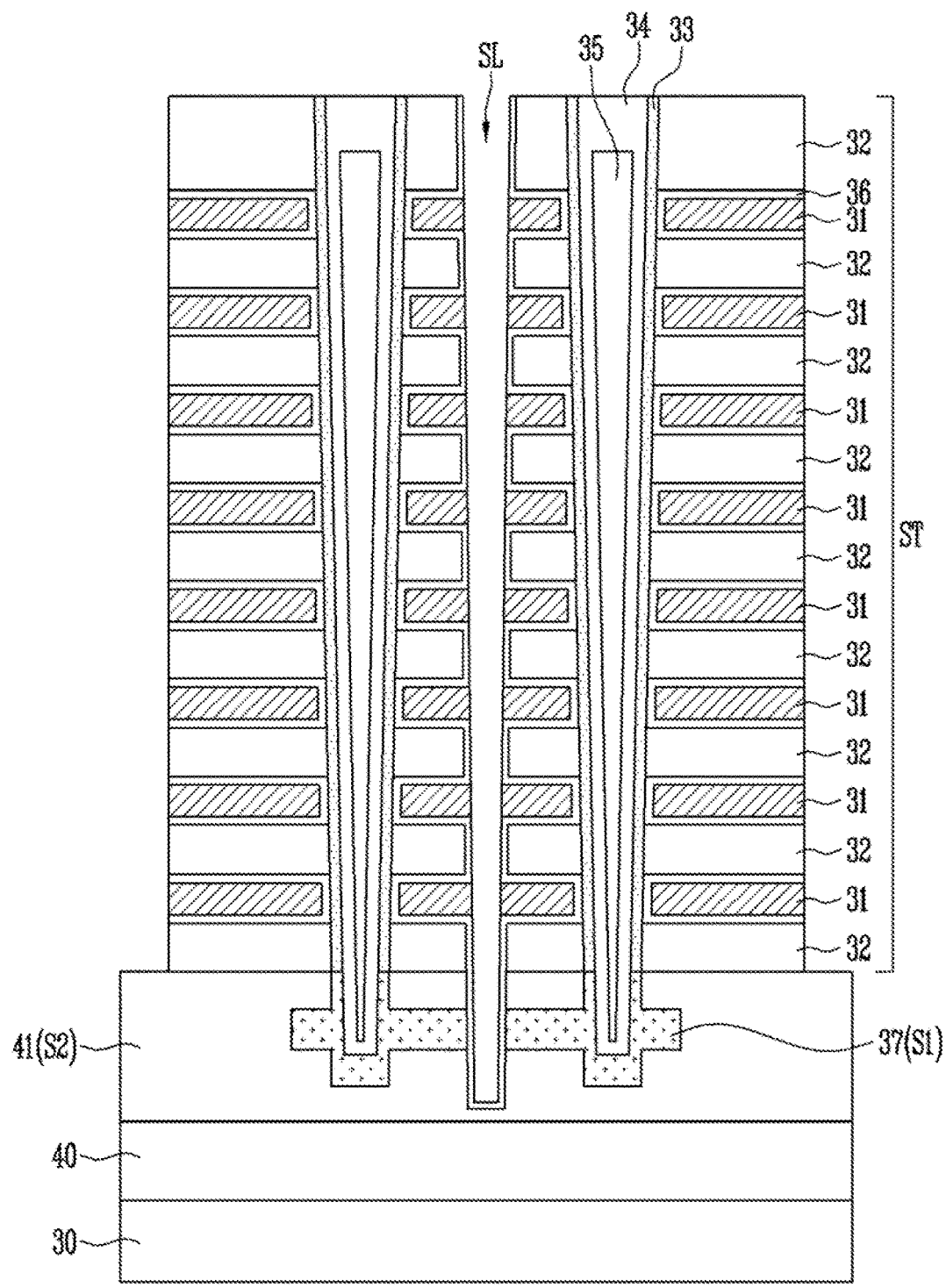

The second source layer 41 may surround at least a portion of the coupling pattern 37. For example, as illustrated in FIG. 3B, the second source layer 41 may surround the top surface and sidewalls of the coupling pattern 37, and the insulating layer 40 may surround a bottom surface of the coupling pattern 37. In another example, as illustrated in FIGS. 3C to 3E, the second source layer 41 may surround an entire surface of the coupling pattern 37, and the insulating layer 40 may be interposed between the second source layer 41 and the substrate 30.

The slit SL may pass through the stacked structure ST and the coupling pattern 37. For example, as illustrated in FIG. 3B, the slit SL may pass through the second source layer 41 and the coupling pattern 37 and be extended to the insulating layer 40. In another example, as illustrated in FIGS. 3C to 3E, the slit SL may be extended into the second source layer 41 by a predetermined depth.

Figure 3D:
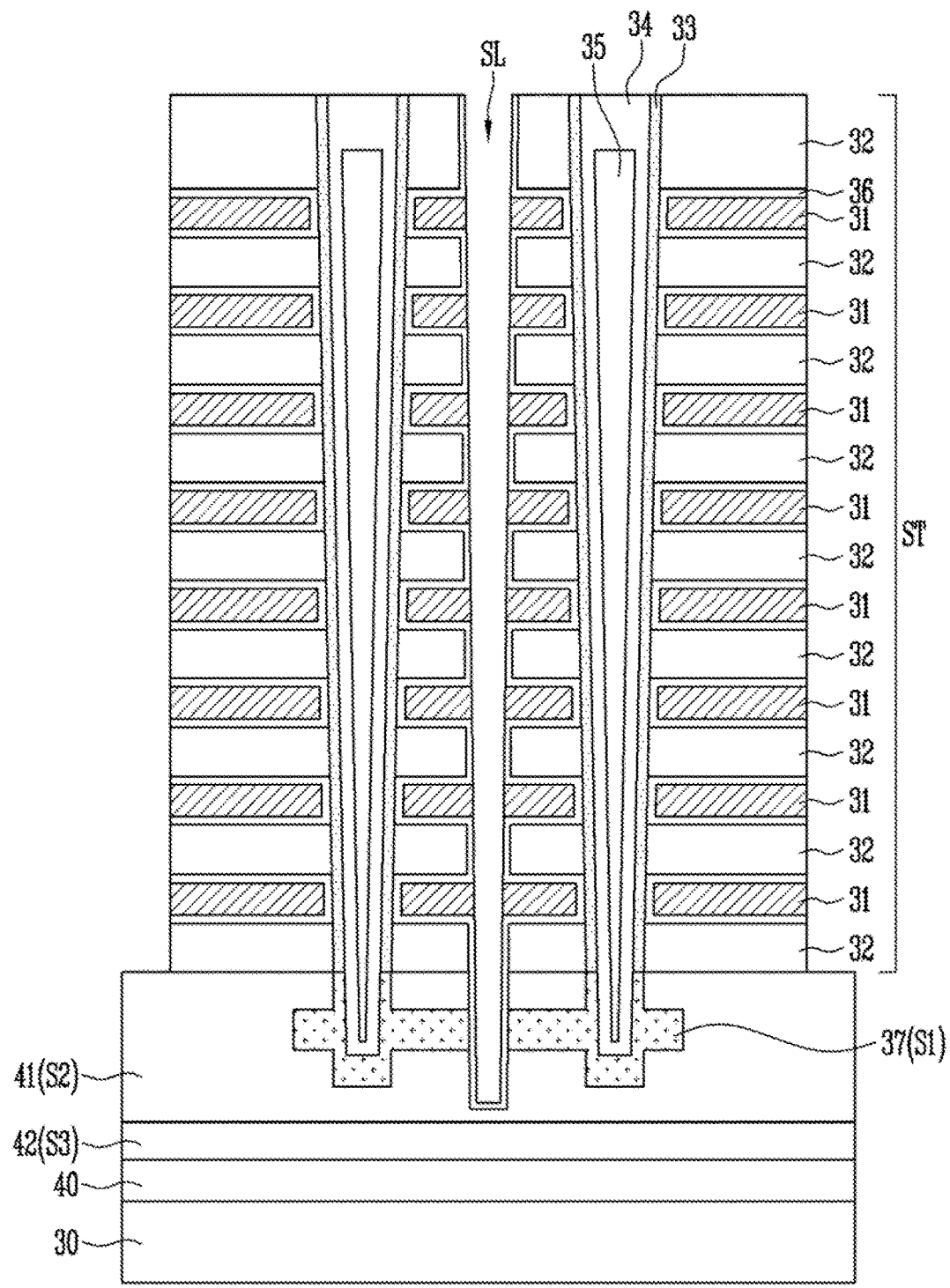
Figure 3E:
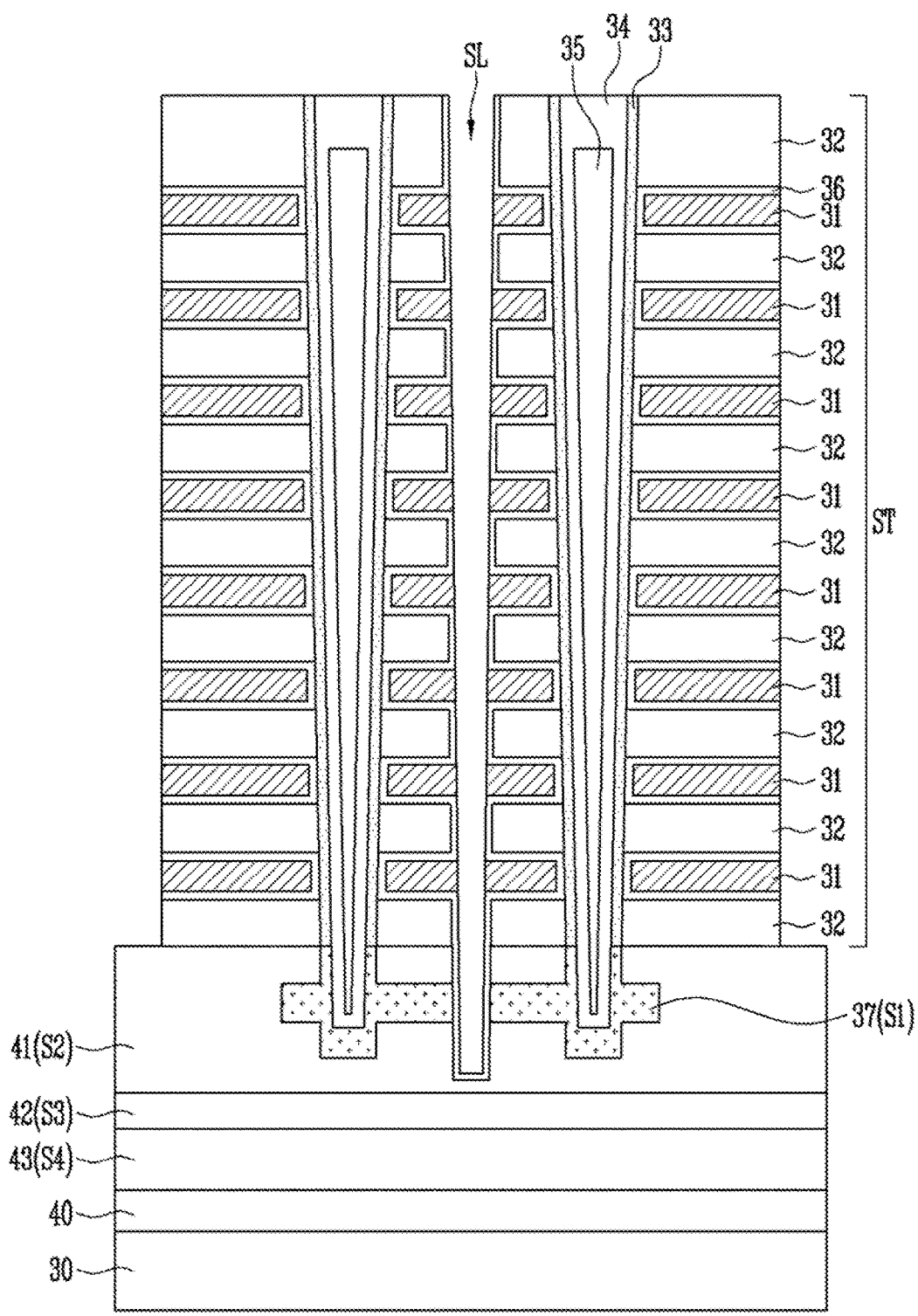

As illustrated in FIG. 3D, the semiconductor device according to an embodiment may further include a third source layer 42 located under the second source layer 41. In addition, as illustrated in FIG. 3E, the semiconductor device may further include a fourth source layer 43 under the third source layer 42. The third source layer 42 may include a metal layer, and the fourth source layer 43 may include a polysilicon layer.

Figure 3F:
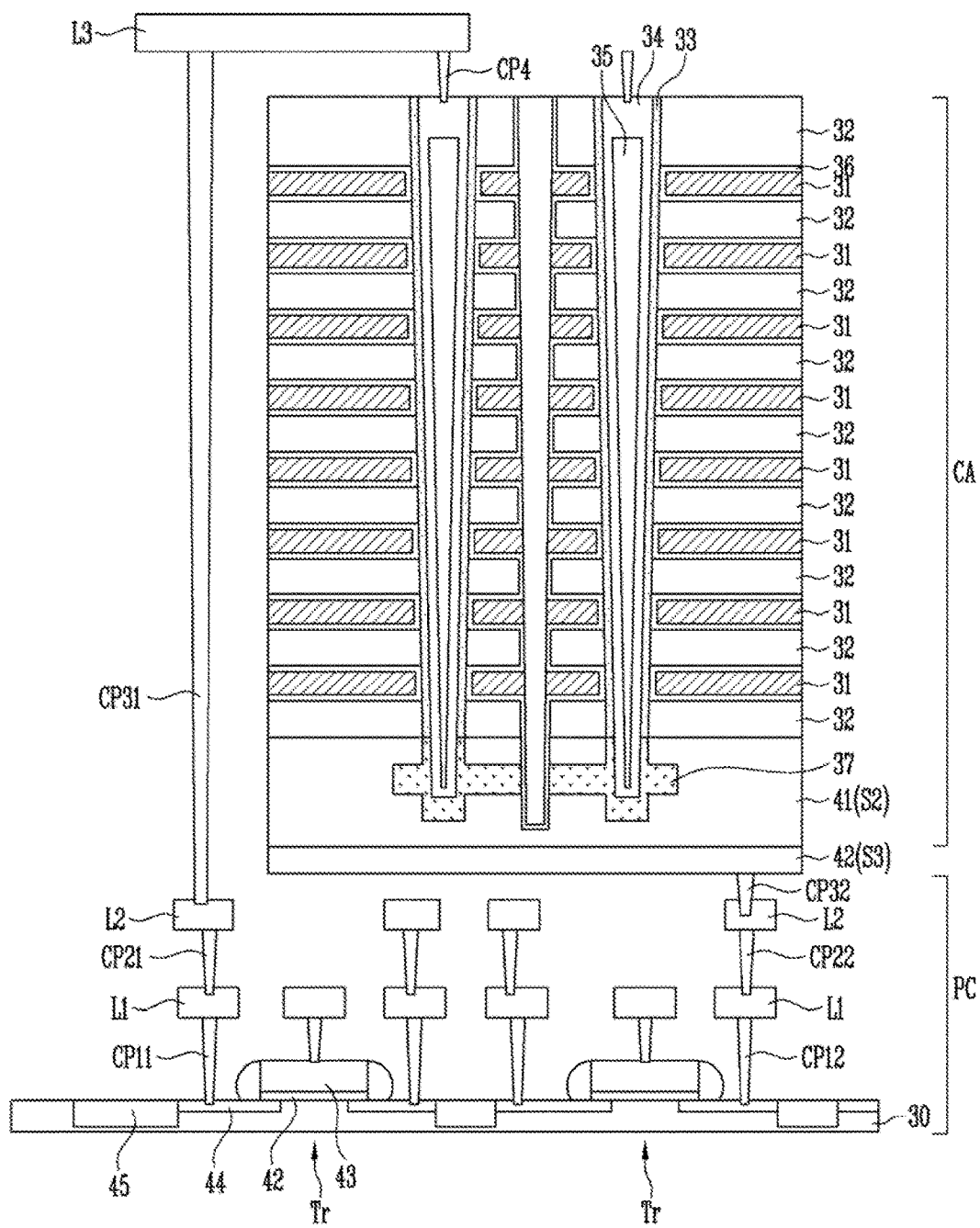

Illustrated in FIG. 3F is a cross-sectional view of a semiconductor device according to an embodiment of the present invention.

As illustrated in FIG. 3F, the semiconductor device may include a cell array CA and a peripheral circuit PC located under the cell array CA. The cell array CA may include the stacked structure and the semiconductor patterns of the earlier-described embodiments.

The peripheral circuit PC may include transistors Tr, capacitors, registers and the like in order to drive the cell array CA. An isolation layer 45 may be located in a field region of the substrate 30, and an active region may be defined by the isolation layer 45. Each of the transistors Tr may include a gate insulating layer 42 and a gate electrode 43 formed in the active region of the substrate 30. Junctions 44 may be formed at both sides of the gate electrode 43 in the substrate 30.

The semiconductor device may include contact plugs and metal lines coupling the cell array CA and the peripheral circuit PC to each other. The peripheral circuit PC may be coupled to the cell array CA through a 1-1$^{st}$ contact pug CP11, a first metal line L1, a 2-1$^{st}$ contact plug CP21, a second metal line L2, a 3-1$^{st}$ contact plug CP31, a third metal line L3 and a fourth contact plug CP4. Thus, the junction 44 of the transistor Tr located in the peripheral circuit PC may be coupled to the channel layer 34 of the cell array CA.

In addition, the peripheral circuit PC may be coupled to the cell array CA through 1-2$^{nd}$ contact plugs CP12, first metal lines L1, 2-2$^{nd}$ contact plugs CP22, second metal lines L2 and 3-2$^{nd}$ contact plugs CP32. Therefore, the junctions 44 of the transistors Tr located in the peripheral circuit PC may be coupled to source layers 37, 41 and 42 of the cell array CA.

FIGS. 4A to 4D are layout views illustrating the semiconductor device described with reference to FIGS. 3A to 3F. For the sake of illustration, FIGS. 4A to 4D show only the locations of the semiconductor patterns 34, the coupling patterns 37, and the slits SL of the semiconductor device.

As illustrated in FIGS. 4A to 4D, the first semiconductor patterns 34 may be arranged in the first direction I-I' and the second direction II-II' crossing the first direction I-I'. The semiconductor patterns 34 may be arranged in a matrix pattern or offset from each other. When the semiconductor patterns 34 arranged in the second direction II-II' are defined as a single column, eight or more columns may be located in one memory block MB of the semiconductor device. The columns may be arranged at regular intervals or irregular intervals.

The coupling patterns 37 may be arranged in a form of line patterns extending in the second direction II-II' and having protrusions formed on sidewalls thereof. For example, when the semiconductor patterns 34 arranged in the second direction II-II' are defined as a single column, at least two columns may share one coupling pattern 37.

The slits SL, SL1 and SL2 may extend in the second direction II-II'. The slits SL, SL1 and SL2 may be located between the coupling patterns 37, and contact the coupling patterns 37. For example, the slits SL, SL1 and SL2 may contact the protrusions of the coupling patterns 37. In addition, some of the slits SL, SL1 and SL2 may be located at the boundary of the memory blocks MB.

Figure 4A:
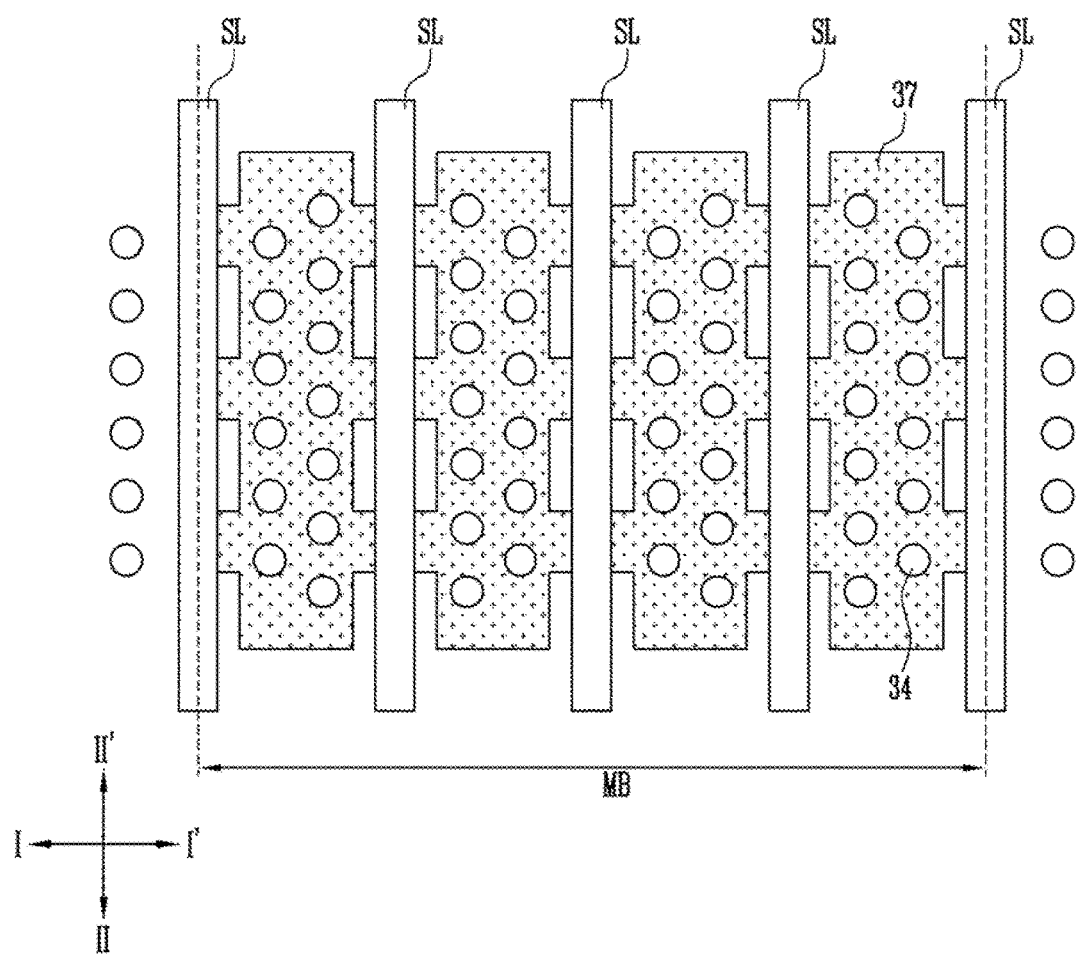

FIG. 4A shows an example in which four coupling patterns 37 are arranged in the form of line patterns in one memory block MB and each of line patterns of the coupling patterns 37 includes protrusions formed on both sidewalls thereof. The semiconductor patterns 34 may be arranged and separated for every two columns. In other words, first and second columns may be adjacent to each other, third and fourth columns may be adjacent to each other, and the second and third columns may be separated from each other. Each of the coupling patterns 37 may surround the adjacent two columns of the semiconductor patterns 34 in its line pattern. The slits SL may contact the protrusions of the coupling patterns 37.

FIG. 4B illustrates an example in which four coupling patterns 37 of the line patterns, each including protrusions formed on one of the sidewalls thereof, are located in one memory block MB. The first slits SL1 located between the neighbouring coupling patterns 37 may contact the protrusions of the neighbouring coupling patterns 37. Therefore, the first slit SL1 may symmetrically contact the neighbouring two coupling patterns 37 on both sides.

The second slits SL2 may be located between the coupling patterns 37 and separated from the coupling patterns 37, or may be located at the boundary of the memory block MB. The first slits SL1 and the second slits SL2 may be formed by separate processes. For example, after the second slits SL2 are formed, insulating layers may be formed in the second slits SL2. Subsequently, the first slits SL1 may be formed. The insulating layer formed in the second slit SL2 may function as a support body during subsequent processes of forming the first slits SL1.

Figure 4C:
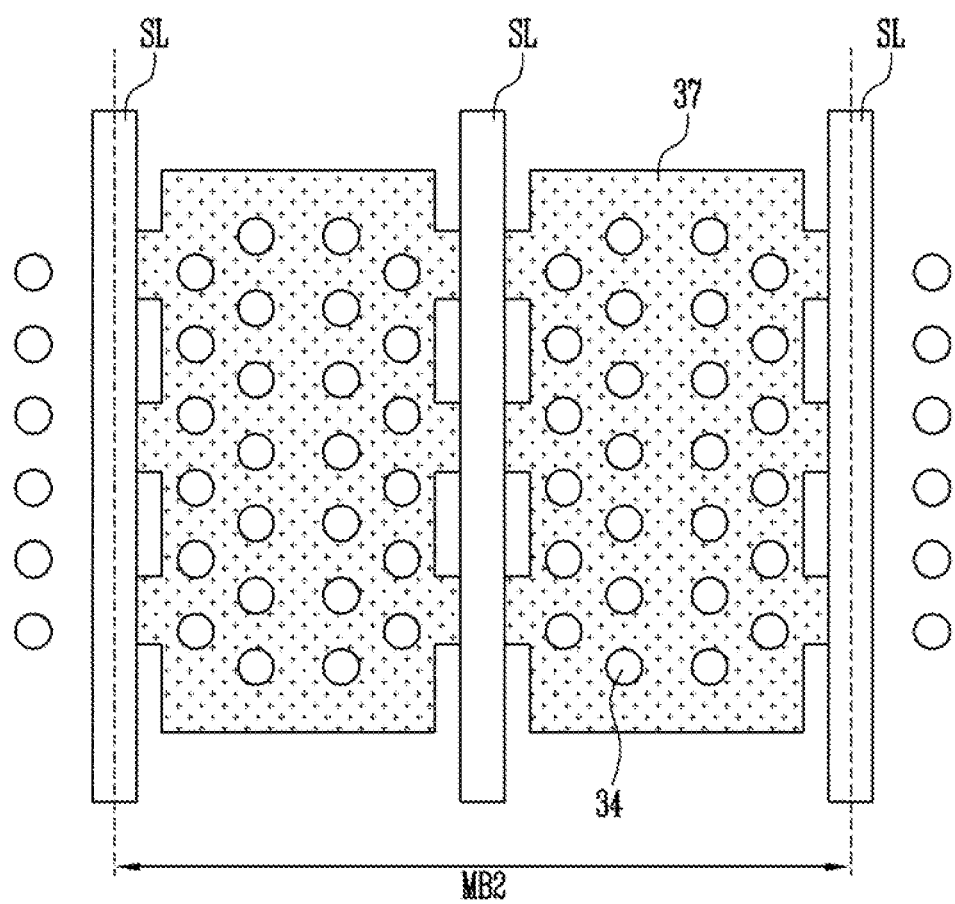

FIG. 4C illustrates an example in which two coupling patterns 37 of the line patterns, each including protrusions formed on both of the sidewalls thereof, are located in one memory block MB. The semiconductor patterns 34 may be separated every four columns. In other words, first to fourth columns may be located adjacent to each other, fifth to eighth columns may be located adjacent to each other, and the fourth and fifth columns may be separated from each other. Each of the coupling patterns 37 may surround the adjacent four columns of the semiconductor patterns 34 in its line pattern. The slits SL may contact the protrusions of the coupling patterns 37.

Figure 4D:
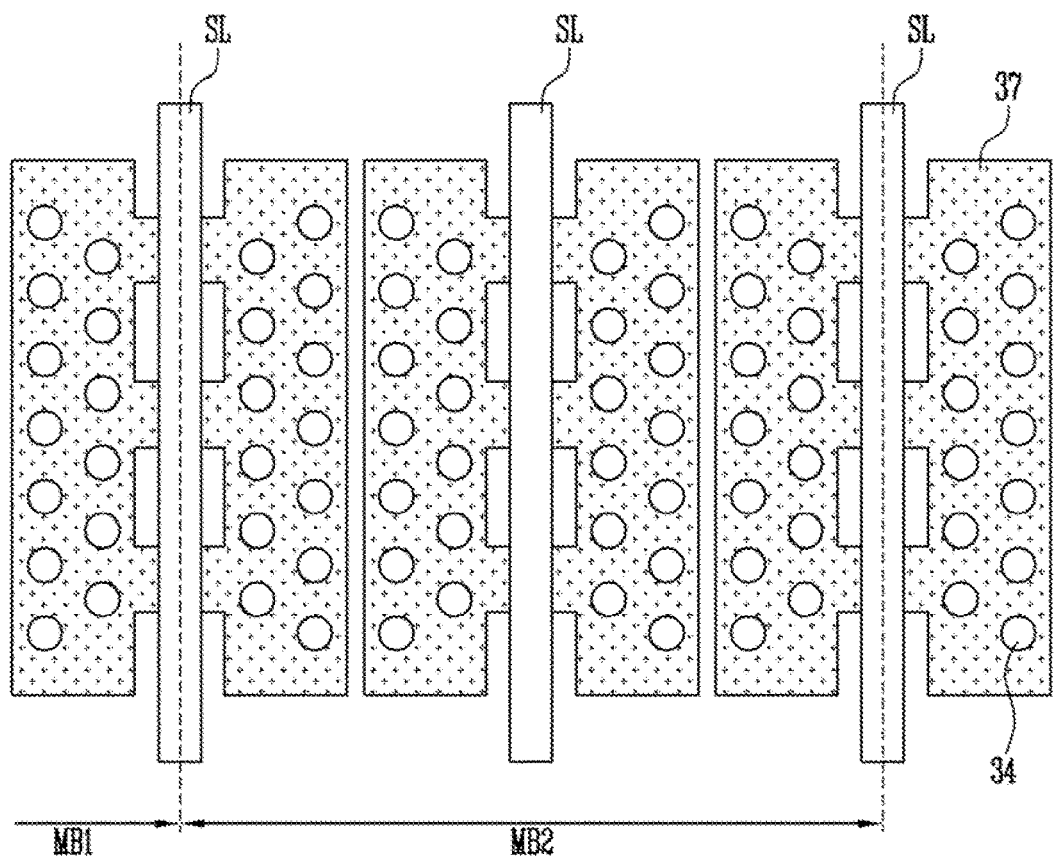

FIG. 4D illustrates an example in which four coupling patterns 37 of the line patterns, each including protrusions formed on one of the sidewalls thereof, are located in one memory block MB. The slit SL located at the boundary between the first memory block MB1 and the second memory block MB2 may contact the protrusions of the coupling pattern 37 of the first memory block MB1 and the protrusions of the coupling pattern 37 of the second memory block MB2.

FIGS. 5A to 5E are cross-sectional views illustrating a method of manufacturing a semiconductor device according to an embodiment of the present invention.

Figure 5A:
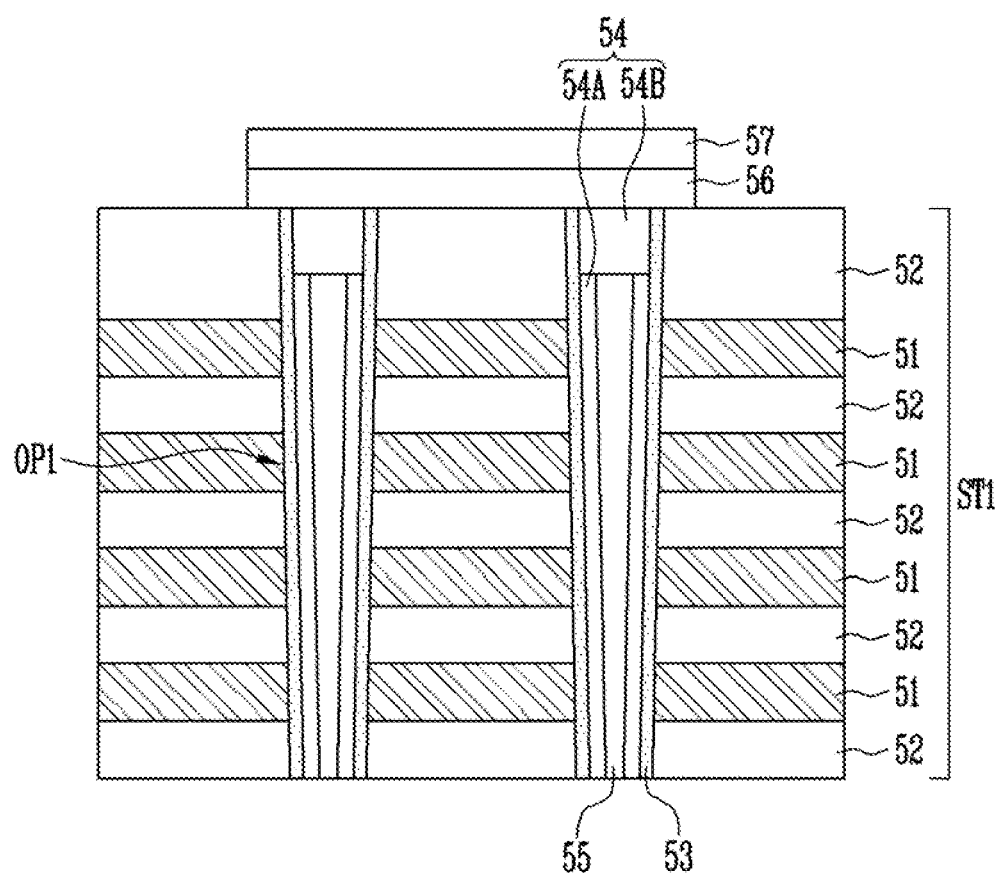
FIGS. 5A to 5E are cross-sectional views illustrating a method of manufacturing a semiconductor device according to an embodiment of the present invention.

As illustrated in FIG. 5A, first material layers 51 and second material layers 52 may be formed alternately with each other to form a first stacked structure ST1. The first material layers 51 may be stacked to form gate conductive layers, and the second material layers 52 may be stacked to form insulating layers that electrically insulate the stacked conductive layers from each other. The uppermost second material layer 52 may have a greater thickness than other second material layers 52.

The first material layers 51 may include a material having a high etch selectivity with respect to the second material layers 52. For example, the first material layers 51 may include a sacrificial layer including a nitride, and the second material layers 52 may include an insulating layer including an oxide. In another example, the first material layers 51 may include a conductive layer including doped polysilicon, doped amorphous silicon or the like, and the second material layers 52 may include a sacrificial layer including undoped polysilicon, undoped amorphous silicon or the like. In this embodiment, a description will be given of an example where the first material layers 51 include sacrificial layers and the second material layers 52 include insulating layers.

Subsequently, first openings OP1 may be formed through the first stacked structure ST1. The first openings OP1 may include various cross sections such as circular, elliptical and polygonal sections. The first openings OP1 may be arranged in a matrix pattern or a zigzag pattern.

Subsequently, a first multilayer dielectric layer 53 may be formed on an inner wall of each of the first openings OP1, and a first semiconductor layer 54A may be formed on the first multilayer dielectric layer 53. Before the first multilayer dielectric layer 53 is formed, a buffer layer (not illustrated) may be further formed in each of the first openings OP1. The buffer layer may prevent the first multilayer dielectric layer 53 from being damaged during subsequent processes, and include an oxide.

After the first insulating layer 55 is formed in an open central portion of the first semiconductor layer 54A, the first insulating layer 55 may be etched to a predetermined depth. When the first insulating layer 55 is etched to the predetermined depth, the first multilayer dielectric layer 53 may also be etched. Subsequently, a first semiconductor plug 54B may be formed in a region where the first insulating layer 55 and the first multilayer dielectric layer 53 are etched. As a result, a first semiconductor pattern 54 may be formed.

Subsequently, a sacrificial pattern 56 may be formed over the first stacked structure ST1. The sacrificial pattern 56 may be used to form a coupling pattern through subsequent processes and overlap at least two first openings OP1. A protective pattern 57 may be formed over the sacrificial pattern 56. For example, after a sacrificial layer and a protective layer are formed over the first stacked structure ST1, the sacrificial pattern 56 and the protective pattern 57 may be formed by patterning the sacrificial layer and the protective layer. The protective pattern 57 may include a material having a high etch selectivity with respect to the sacrificial pattern 56. For example, the sacrificial pattern 56 may include a titanium nitride layer (TiN), and the protective pattern 57 may include a doped polysilicon layer or an undoped polysilicon layer.

Figure 5B:
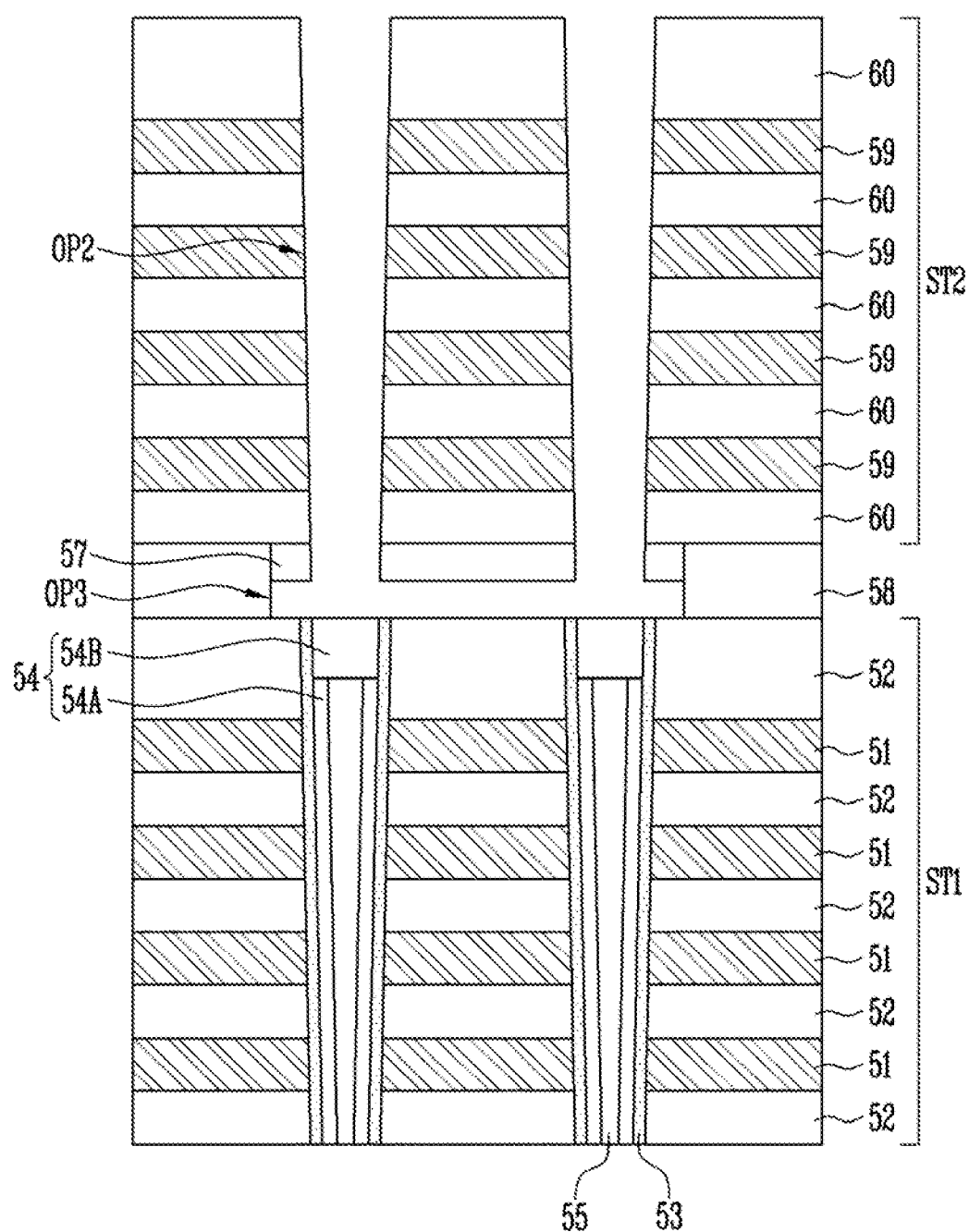

As illustrated in FIG. 5B, after a third insulating layer 58 is formed over the first stacked structure ST1, the third insulating layer 58 may be planarized to expose a top surface of the protective pattern 57. Subsequently, third material layers 59 and fourth material layers 60 may be formed alternately with each other to form a second stacked structure ST2. The third material layers 59 may correspond to the above-described first material layers 51, and the fourth material layers 60 may correspond to the above-described second material layers 52.

Subsequently, second openings OP2 may be formed through the second stacked structure ST2 and the protective pattern 57. The second openings OP2 may be deep enough to expose the sacrificial pattern 56 and include various cross sections such as circular, elliptical and polygonal sections. The second openings OP2 may be formed at positions corresponding to the first openings OP1. In another example, the second openings OP2 may be formed through the sacrificial pattern 56 and extended into the first semiconductor patterns 54 to a predetermined depth by etching. Subsequently, the sacrificial pattern 56 may be removed through the second openings OP2 to form a third opening OP3.

Figure 5C:
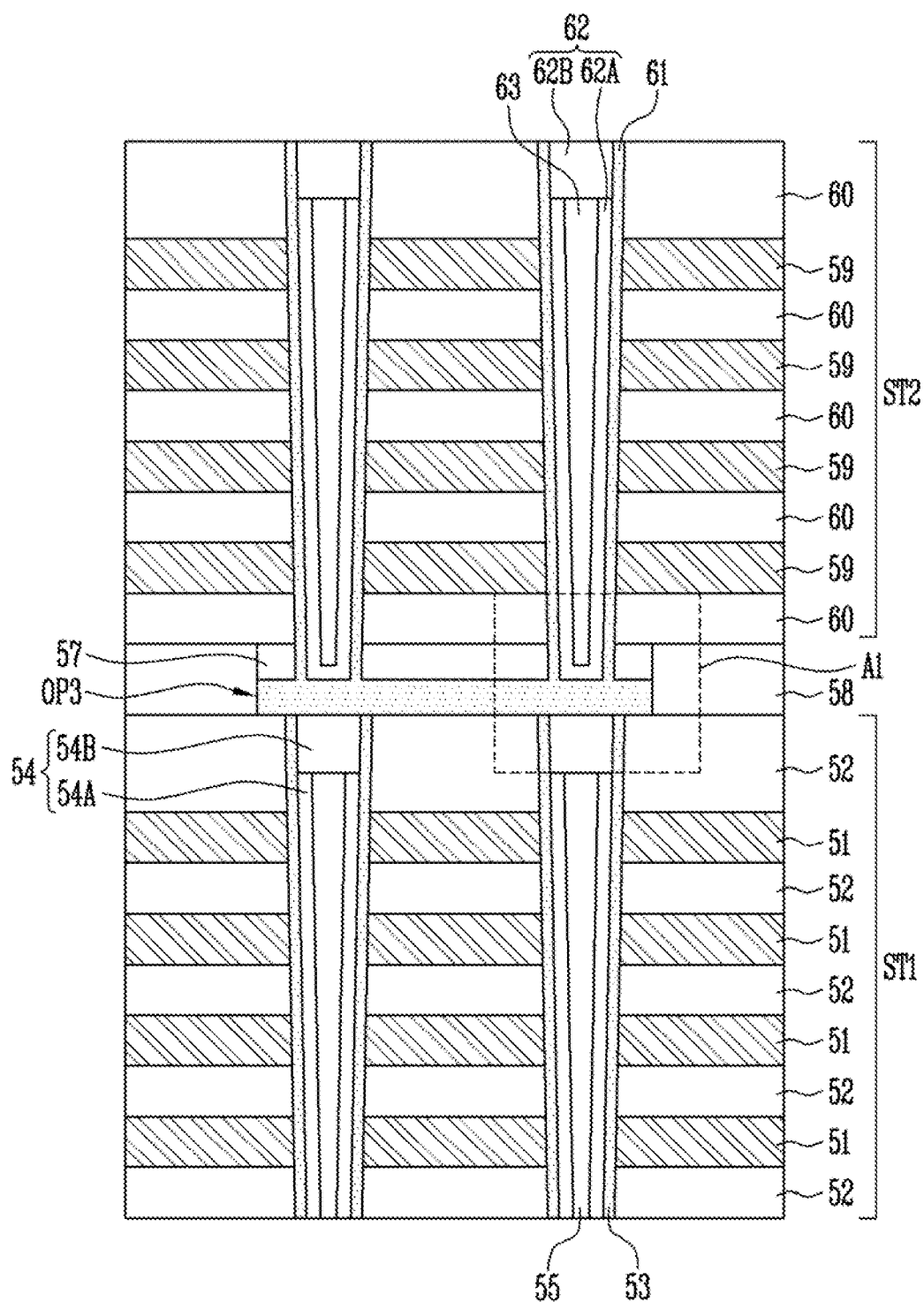

As illustrated in FIG. 5C, a second multilayer dielectric layer 61 may be formed in the second and third openings OP2 and OP3. The third opening OP3 may be completely filled with the second multilayer dielectric layer 61 and the second multilayer dielectric layer 61 may be formed on inner walls of the second openings OP2. Before the second multilayer dielectric layers 61 are formed, buffer layers (not illustrated) may be further formed in the second openings OP2. The buffer layer may include an oxide and prevent the second multilayer dielectric layer 61 from being damaged during subsequent processes.

After a second semiconductor layer 62A is formed in each of the second openings OP2, a second insulating layer 63 may be formed in a central region of the second semiconductor layer 62A. Next, the second insulating layer 63 may be etched to a predetermined depth to form a second semiconductor plug 62B. As a result, a second semiconductor pattern 62 may be formed.

Figure 5D:
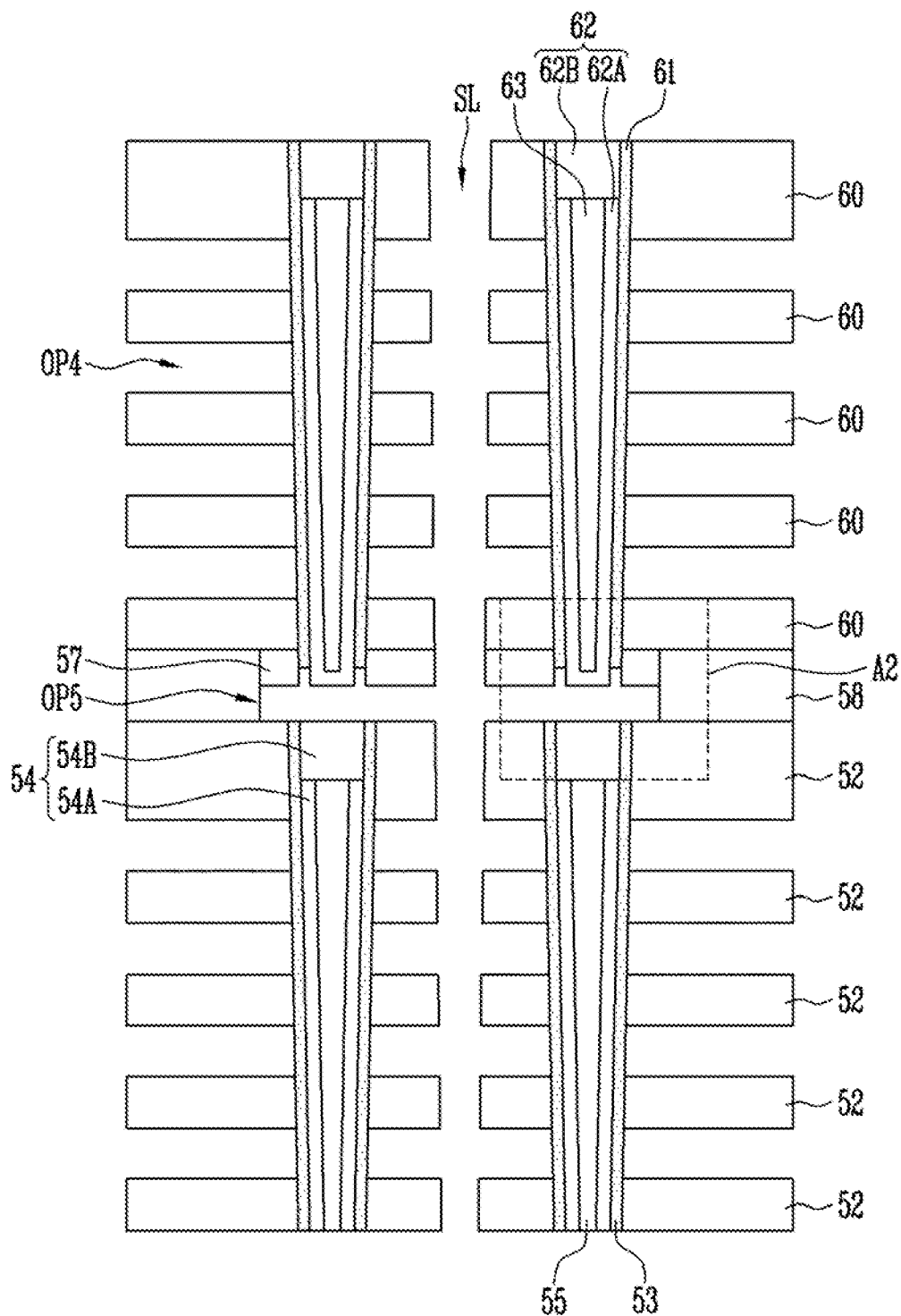

As illustrated in FIG. 5D, the slit SL may be formed through the second stacked structure ST2, the third opening OP3, the protective pattern 57 and the first stacked structure ST1. The slit SL may be located between the second openings OP2 connected to the third opening OP3.

Subsequently, the first and third material layers 51 and 59 may be removed through the slit SL to form fourth openings OP4, through which the multilayer dielectric layers 53 and 61 are exposed, and the second multilayer dielectric layer 61 exposed through the slit SL may be removed to form fifth openings OP5. When buffer layers are formed in the second openings OP2, the buffer layers may be removed after the first and third material layers 51 and 59 are removed, so that the fourth openings OP4 may be formed. The fourth openings OP4 and the fifth openings OP5 may be formed simultaneously or separately.

Figure 5E:
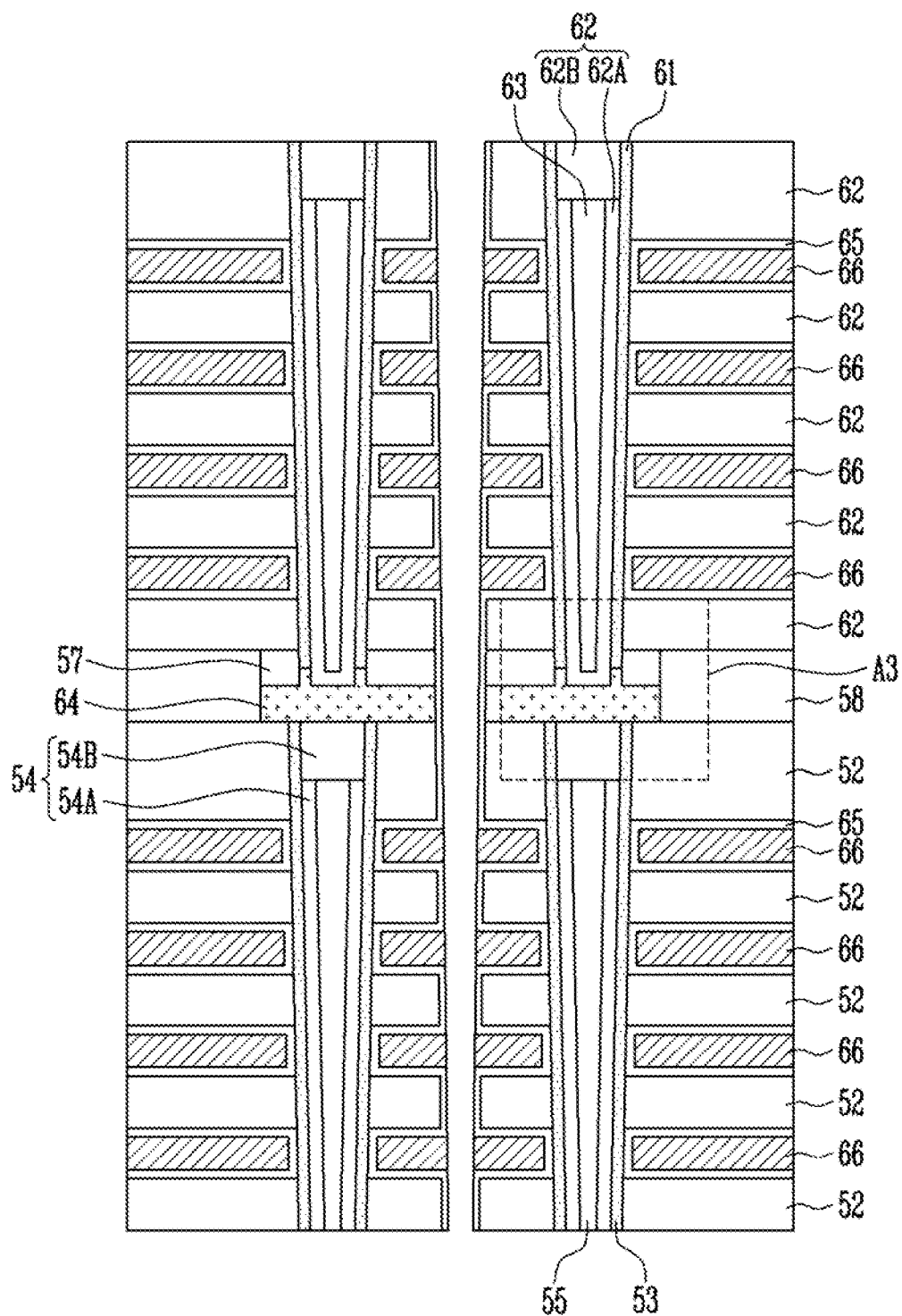

As illustrated in FIG. 5E, coupling patterns 64 may be formed in the fifth opening OP5. For example, the coupling pattern 64 may be grown from the first semiconductor pattern 54 or the protective pattern 57 by using an epitaxial growth process. The coupling pattern 64 may include a conductive material such as a metal silicide layer. Subsequently, conductive layers 66 may be formed in the fourth openings OP4. Before the conductive layers 66 are formed, dielectric patterns 65 may be further formed in the fourth openings OP4.

According to the earlier-described processes, the second semiconductor patterns 62 may be formed after the first semiconductor patterns 54 are formed, and the first semiconductor patterns 54 and the second semiconductor patterns 62 may be coupled by the coupling pattern 64. Therefore, when strings arranged in a vertical direction are formed using these processes, a channel layer having a high aspect ratio may be formed. In addition, deterioration in cell current may be prevented by removing the interface between the first semiconductor pattern 54 and the second semiconductor pattern 62 or by coupling the first semiconductor pattern 54 and the second semiconductor pattern 62 by using a conductive layer.

FIGS. 6A to 6E are cross-sectional views illustrating a method of manufacturing a semiconductor device according to an embodiment of the present invention. A description focused on features illustrated by the drawings will now be made.

Figure 6A:
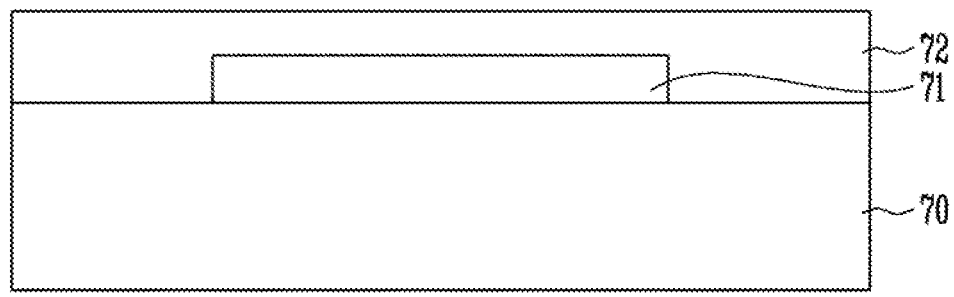
FIGS. 6A to 6E are cross-sectional views illustrating a method of manufacturing a semiconductor device according to an embodiment of the present invention.

As illustrated in FIG. 6A, a sacrificial pattern 71 may be formed over a substrate 70, and an insulating layer 72 may cover the sacrificial pattern 71. Though not illustrated in FIG. 6A, a protective pattern may also be formed over the sacrificial pattern 71.

Figure 6B:
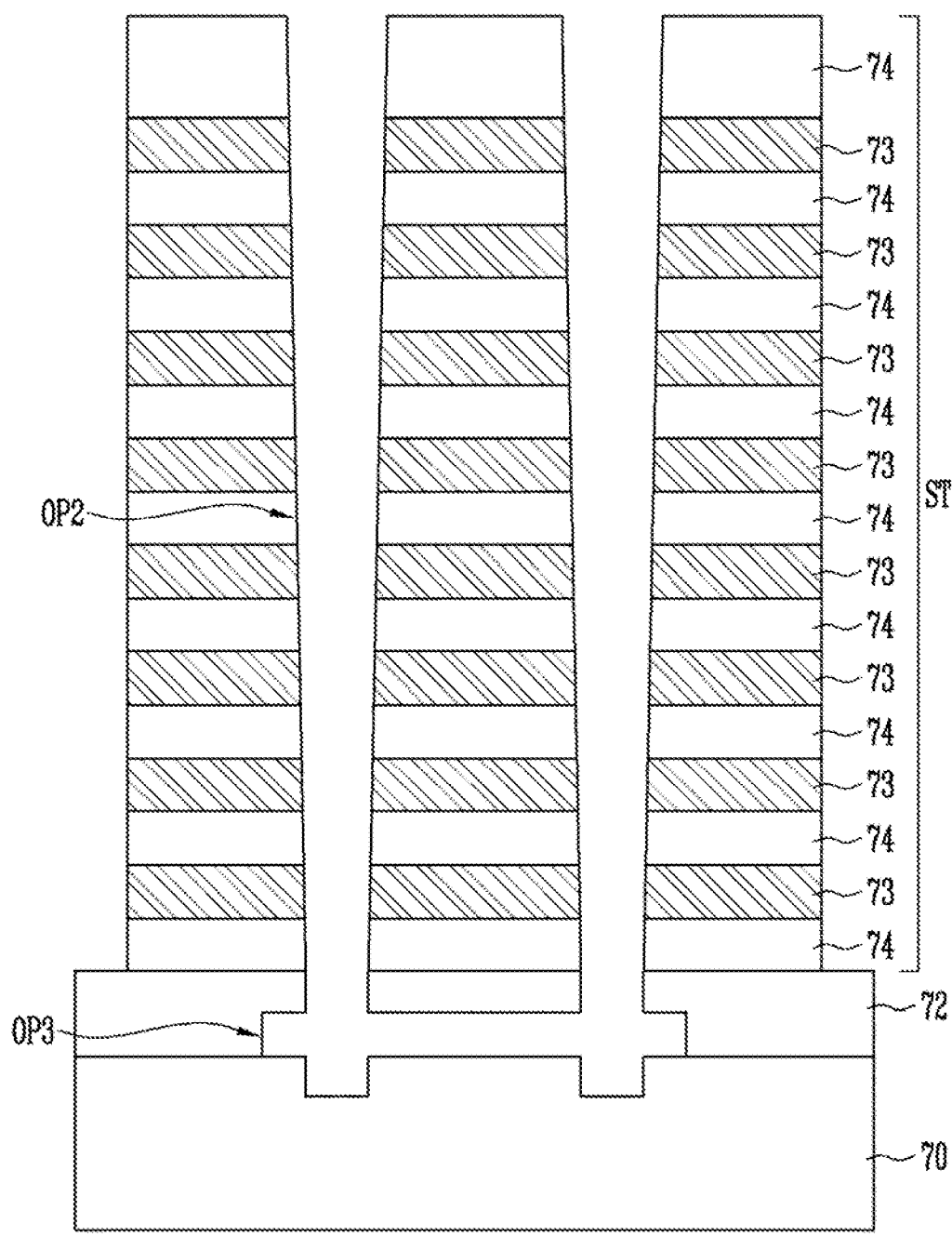

As illustrated in FIG. 6B, the stacked structure ST that includes first material layers 73 and second material layers 74 may be formed. The first material layers 73 and the second material layers may be alternately formed over the insulating layer 72. Subsequently, the second openings OP2 passing through the stacked structure ST and the sacrificial pattern 71 may be formed. The second openings OP2 may be deep enough to expose the substrate 70. The substrate 70 may be etched to a predetermined depth to form grooves therein. Subsequently, the sacrificial pattern 71 exposed through the second openings OP2 may be removed to form the third opening OP3.

Figure 6C:
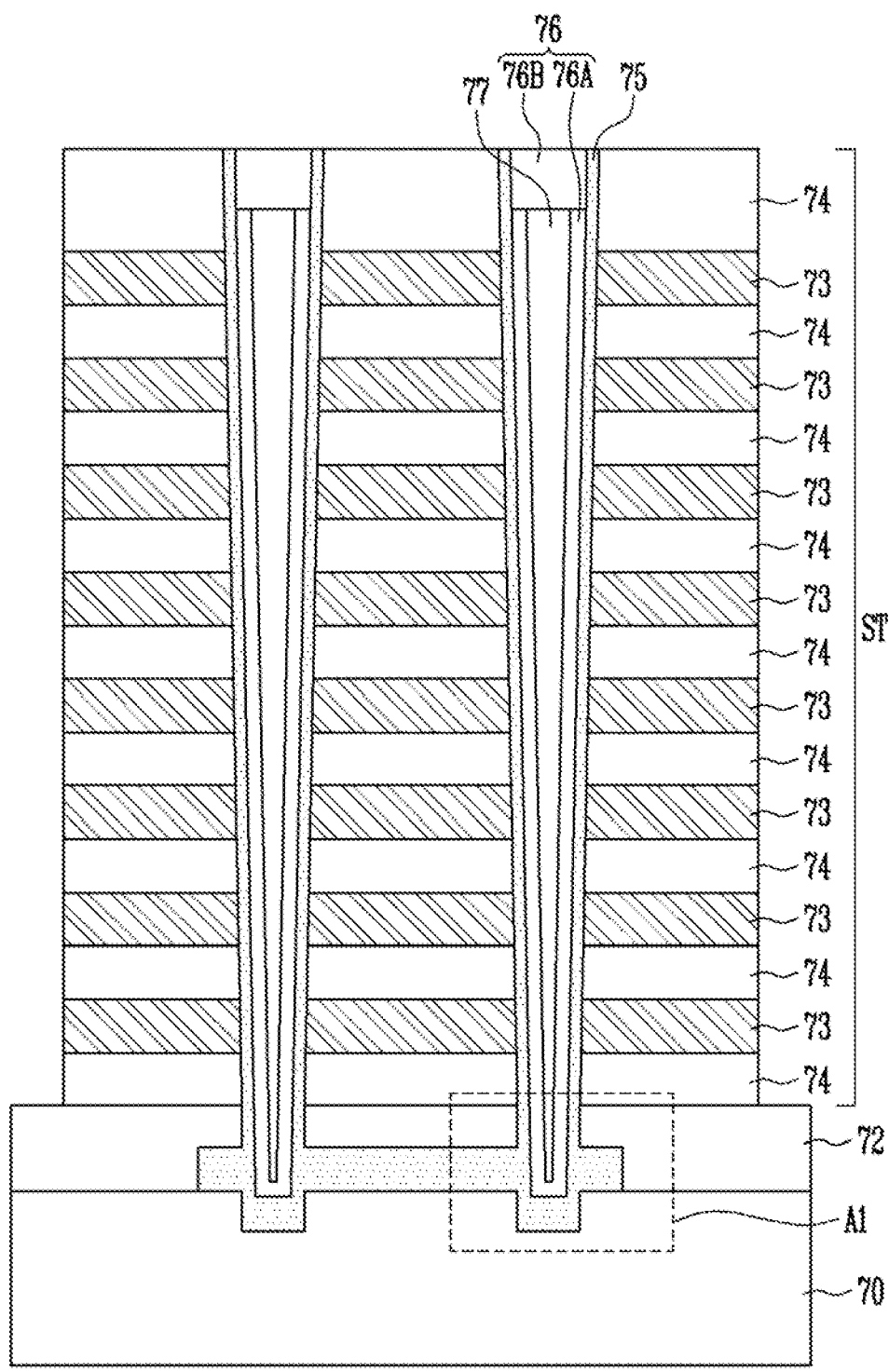

As illustrated in FIG. 6C, multilayer dielectric layers 75 may be formed in the second and third openings OP2 and OP3. The third opening OP3 may be completely filled with the multilayer dielectric layer 75, and the multilayer dielectric layers 75 may be formed on inner walls of the second openings OP2. Subsequently, a semiconductor layer 76A may be formed in each of the second openings OP2, and an insulating layer 77 may be formed in a central region of the semiconductor layer 76A. Subsequently, the insulating layer 77 may be etched to a predetermined depth. When the insulating layer 77 is etched to the predetermined depth, the multilayer dielectric layer 75 may also be etched. Subsequently, a semiconductor plug 76B may be formed in a region where the insulating layer 77 and the multilayer dielectric layer 75 are etched. As a result, semiconductor patterns 76 may be formed. Before the multilayer dielectric layer 75 is formed, a buffer layer (not illustrated) may be further formed in each of the second openings OP2. The buffer layer may include an oxide and prevent the multilayer dielectric layer 75 from being damaged during subsequent processes.

Figure 6D:
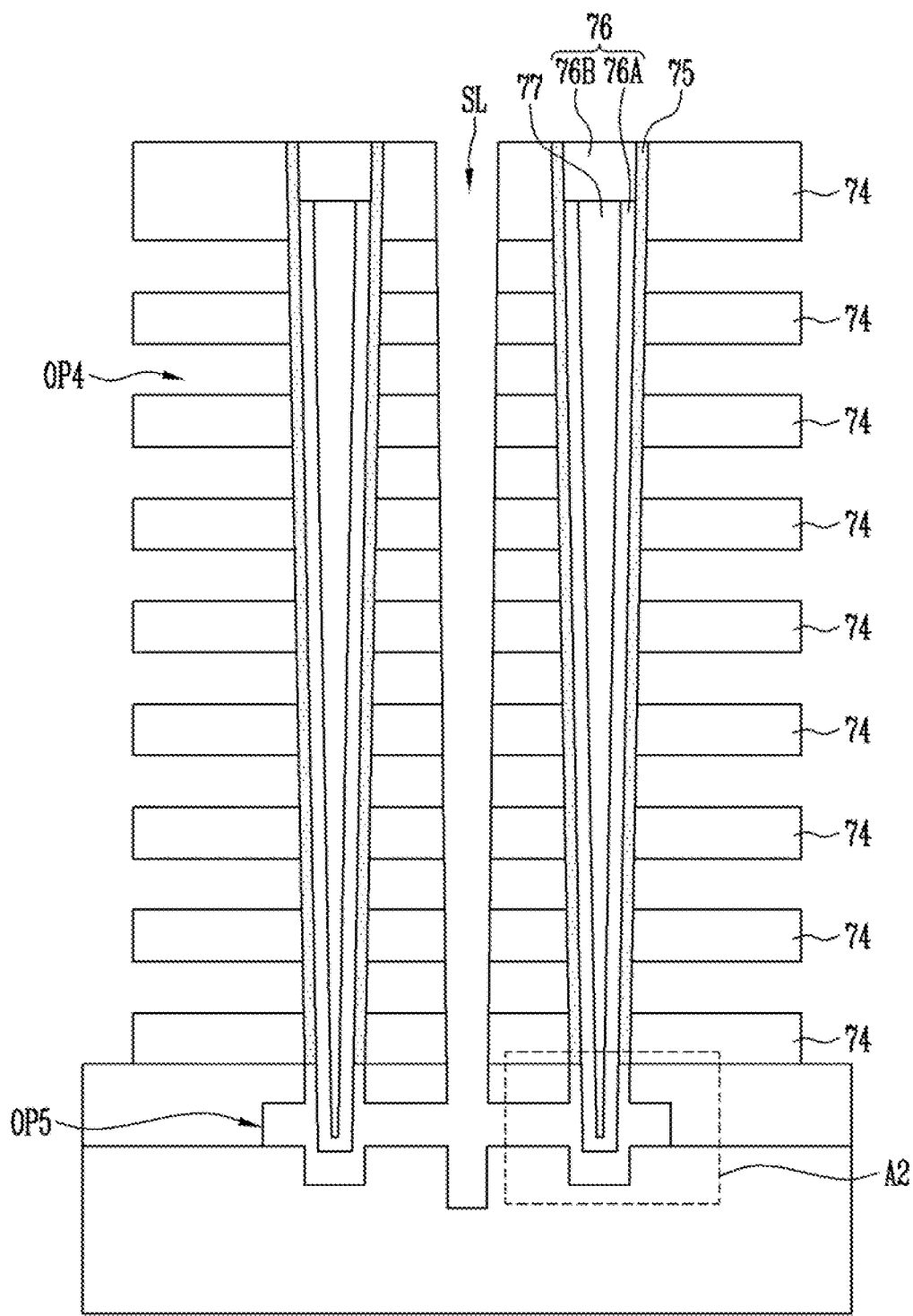

As illustrated in FIG. 6D, the slit SL may be formed through the stacked structure ST and the second opening OP2. The slit SL may be deep enough to expose the substrate 70.

Subsequently, the first material layers 73 may be removed through the slit SL to form the fourth openings OP4 through which the multilayer dielectric layer 75 is exposed. When buffer layers are formed in the second openings OP2, the buffer layers may be removed after the first material layers 73 are removed, so that the fourth openings OP4 may be formed. The multilayer dielectric layer 75 exposed through the slit SL may be removed to form the fifth opening OP5. The fourth openings OP4 and the fifth openings OP5 may be formed simultaneously or separately.

Figure 6E:
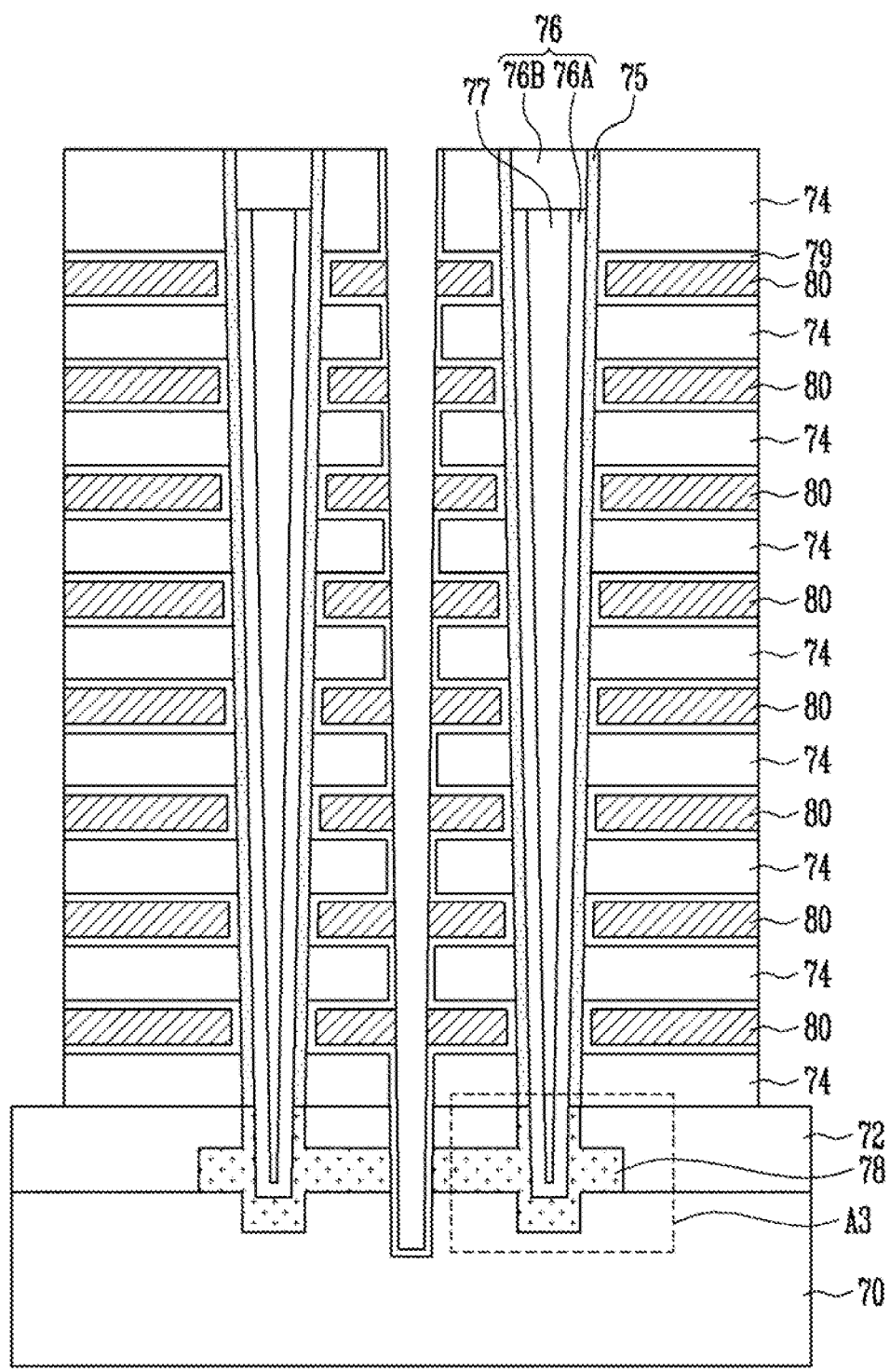

As illustrated in FIG. 6E, a coupling pattern 78 may be formed in the fifth opening OP5. The coupling pattern 78 may be a metal silicide layer. Conductive layers 80 may be formed in the fourth openings OP4. Before the conductive layers 80 are formed, dielectric patterns 79 may be additionally formed in the fourth openings OP4.

According to the above-described processes, the coupling pattern 78 that surrounds lower portions of the semiconductor patterns 76 may be easily formed. Since the coupling pattern 78 is formed by partially removing the multilayer dielectric layer 75, a channel layer and a source layer may be easily coupled to each other without damaging the multilayer dielectric layer 75 in a memory cell region. Therefore, deterioration in characteristics of the semiconductor device may be prevented.

Figure 7A:
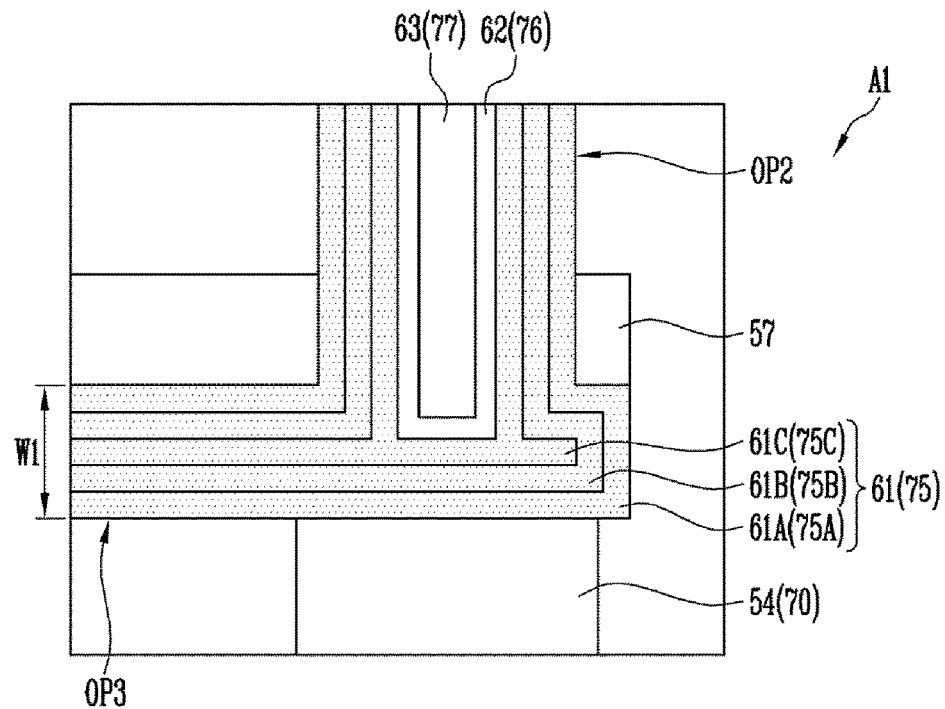
FIGS. 7A to 7D are cross-sectional views illustrating a method of manufacturing a semiconductor device according to an embodiment of the present invention.
Figure 7B:
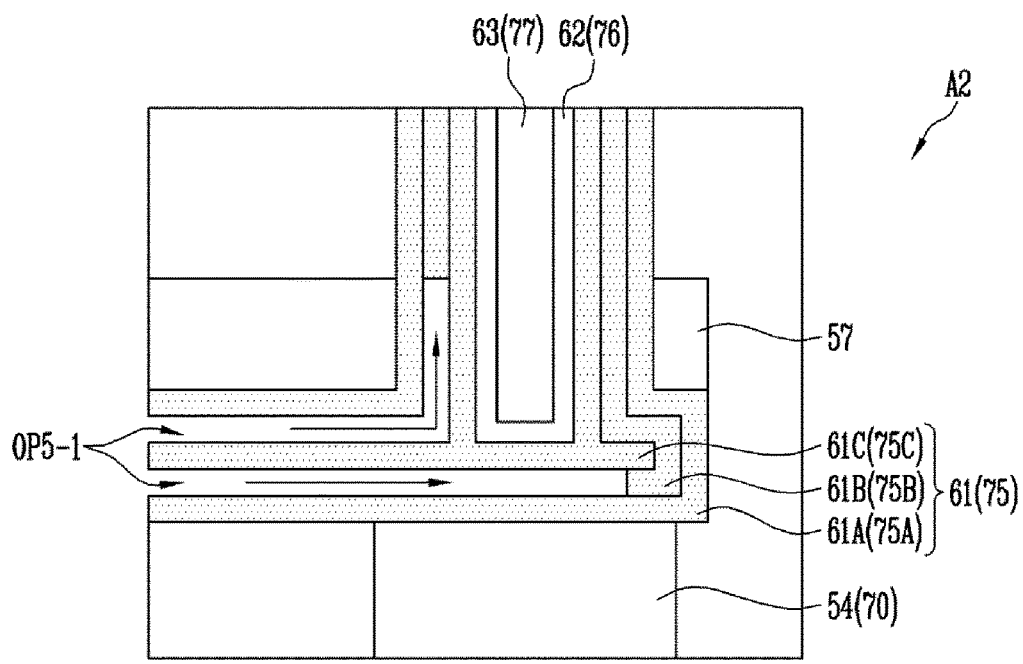
Figure 7C:
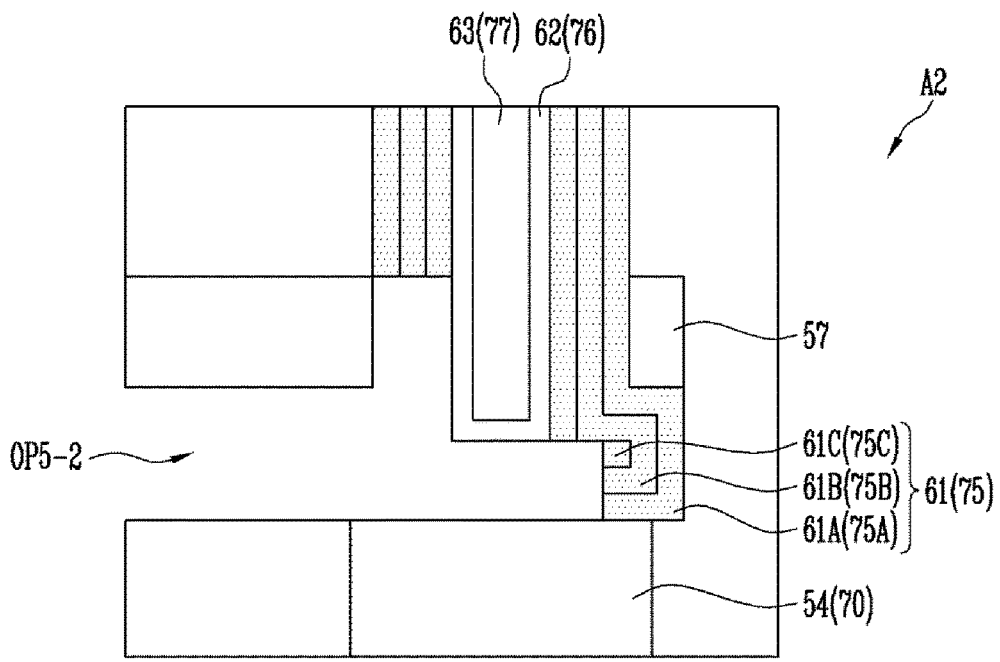
Figure 7D:
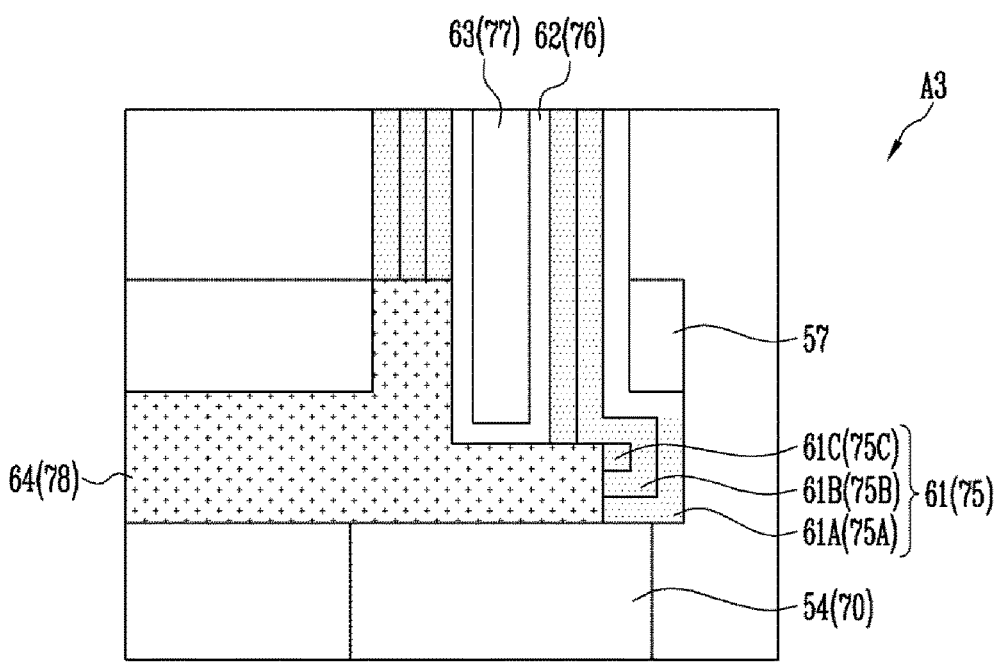

FIGS. 7A to 7D are cross-sectional views illustrating a method of manufacturing a semiconductor device according to an embodiment of the present invention. FIG. 7A is a view enlarging regions A1 shown in FIGS. 5C and 6C. FIGS. 7B and 7C are views enlarging regions A2 of FIGS. 5D and 6D. FIG. 7D is a view enlarging regions A3 of FIGS. 5E and 6E. FIGS. 7A to 7D show reference characters of both FIGS. 5C to 5E and FIGS. 6C to 6E for illustrative purposes.

FIGS. 7A to 7D show the embodiments of both FIGS. 5C to 5E and 6C to 6E, where the second opening OP2 is deep enough to expose the sacrificial pattern 56 (71) and is not extended to the underlying semiconductor pattern 54 (substrate 70). As described above with reference to FIG. 1A, each of the multilayer dielectric layers 61 (75) may include one or more of the charge blocking layer 61A (75A), the data storage layer 61B (75B) and the tunnel insulating layer 61C (75C). The data storage layer 61B (75B) may include the charge trap layer such as a nitride layer, a polysilicon layer, nanodots, and a phase-change material layer. In the embodiments, the thickness W1 of the third opening OP3, or the horizontal portion 17B of the coupling pattern 17, may be more than twice as much as the sum of thicknesses of the charge blocking layer 61A (75A) and the data storage layer 61B (75B), and less than twice as much as the sum of thicknesses of the charge blocking layer 61A (75A), the data storage layer 61B (75B) and the tunnel insulating layer 61C (75C).

As illustrated in FIGS. 5C, 6C and 7A, the multilayer dielectric layer 61 (75), the semiconductor pattern 62 (76) and the insulating layer 63 (77) may be formed in the second and third openings OP2 and OP3. The multilayer dielectric layer 61 (75) may include the charge blocking layer 61A (75A), the data storage layer 61B (75B), and the tunnel insulating layer 61C (75C). The charge blocking layer 61A (75A), the data storage layer 61B (75B), and the tunnel insulating layer 61C (75C) may be formed in the third opening OP3.

As illustrated in FIGS. 5D, 6D and 7B, the fourth openings OP4 may be formed by removing the first material layers 51 (73) and the third material layers 59. At this time, a portion of the multilayer dielectric layer 61 (75) formed in the third opening OP3 may also be removed. For example, when the first and third material layers 51, 59 and 73 include nitride layers, the data storage layer 61B (75B) may also be removed.

At this time, the data storage layer 61B (75B) is removed in a horizontal direction and a vertical direction (directions of arrow shown in FIG. 7B) from the slit SL. Part of the data storage layer 61B (75B), which is adjacent to the slit SL, may firstly start to be removed. In other words, the data storage layer 61B (75B) may be removed asymmetrically about the semiconductor pattern 62 (76). As a result, a 5-$1^{st}$ opening OP5-1 may be formed. The size of the 5-$1^{st}$ opening OP5-1 may vary depending on the amount of time for removing the data storage layer 61B (75B).

As illustrated in FIGS. 5D, 6D and 7C, part of the charge blocking layer 61A (75A) and the tunnel insulating layer 61C (75C), which are exposed through the 5-$1^{st}$ opening OP5-1, may be removed. For example, in a case where buffer layers are formed in the second openings OP2, the charge blocking layer 61A (75A) and the tunnel insulating layer 61C (75C) may also be removed while the buffer layers exposed through the fourth openings OP4 are removed. As a result, without an additional process, a 5-$2^{nd}$ opening OP5-2 may be naturally formed when the fourth openings OP4 are formed.

As illustrated in FIGS. 5E, 6E and 7D, the coupling pattern 64 (78) may be formed in the 5-$2^{nd}$ opening OP5-2. For example, after a silicon layer is selectively grown from the protective pattern 57, the semiconductor pattern 54, or the substrate 70, the silicon layer may be silicided using a metal layer, so that the coupling pattern 64 (78) including metal silicide may be formed. As a result, the coupling pattern 64 (78) that includes the horizontal portion coupled to the lower portions of the semiconductor patterns 62 (76) and the vertical portions protruding from the horizontal portion and surrounding the sidewalls of the semiconductor patterns 62 (76) may be formed. As described above, when the coupling pattern 64 (78) is formed by growing a silicon layer, interface characteristics between the coupling pattern 64 (78) and the semiconductor pattern 62 (76) may be improved.

The shape of the coupling pattern 64 (78) may vary depending on depth of the second opening OP2, and the amount removed of the multilayer dielectric layer 61 (75). According to this embodiment, the vertical portion of the coupling pattern 64 (78) may asymmetrically surround the sidewall of the semiconductor pattern 62 (76).

Figure 8A:
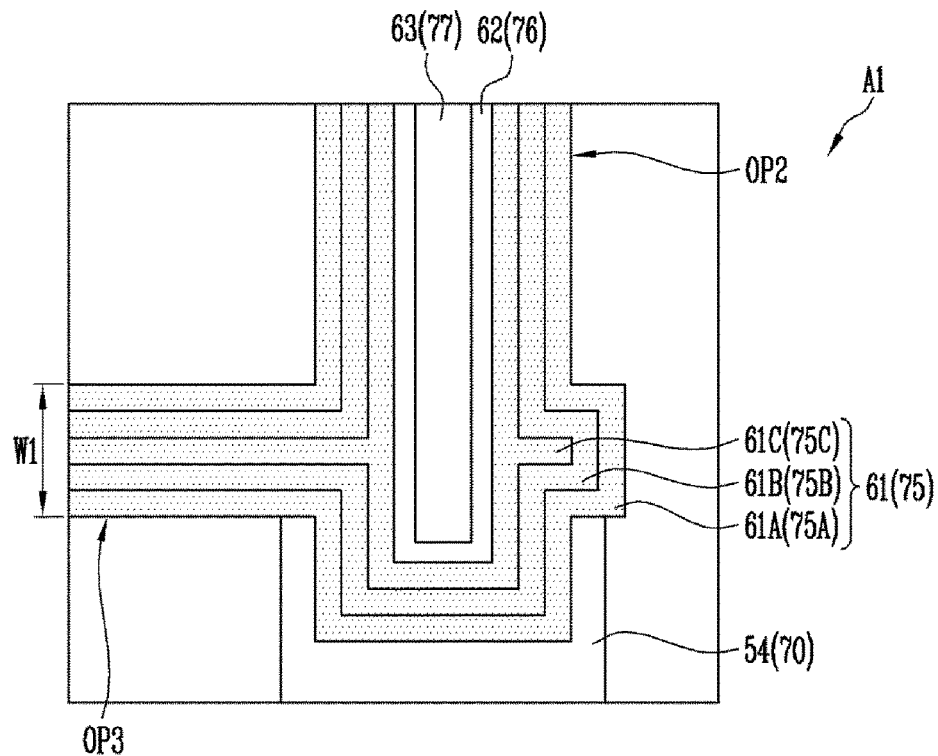
FIGS. 8A to 8D are cross-sectional views illustrating a method of manufacturing a semiconductor device according to an embodiment of the present invention.
Figure 8B:
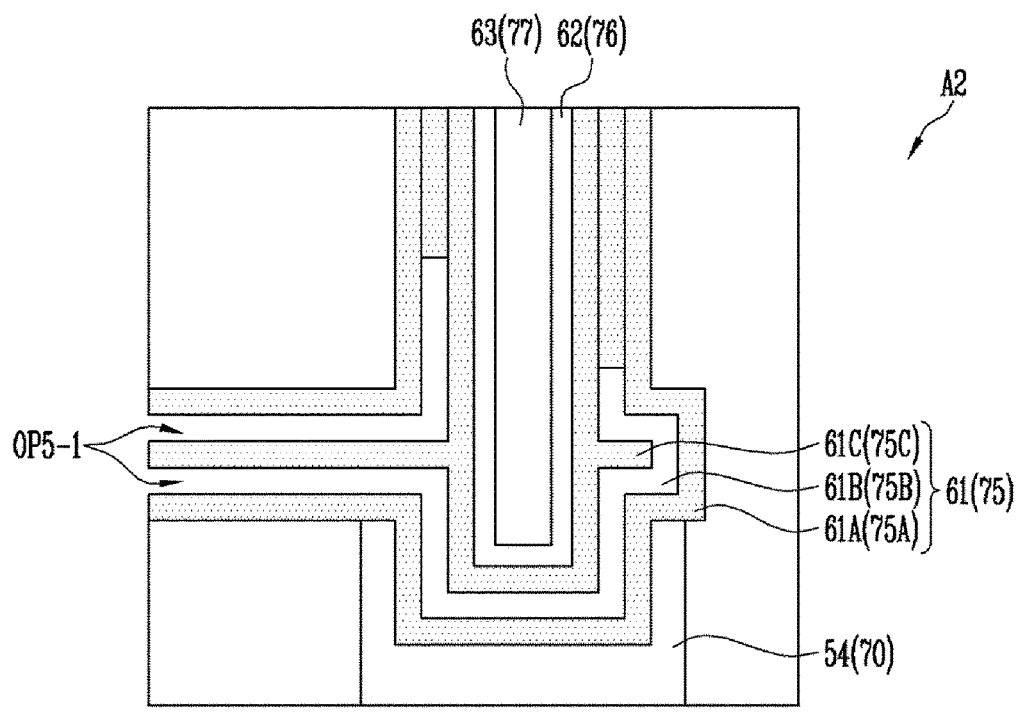
Figure 8C:
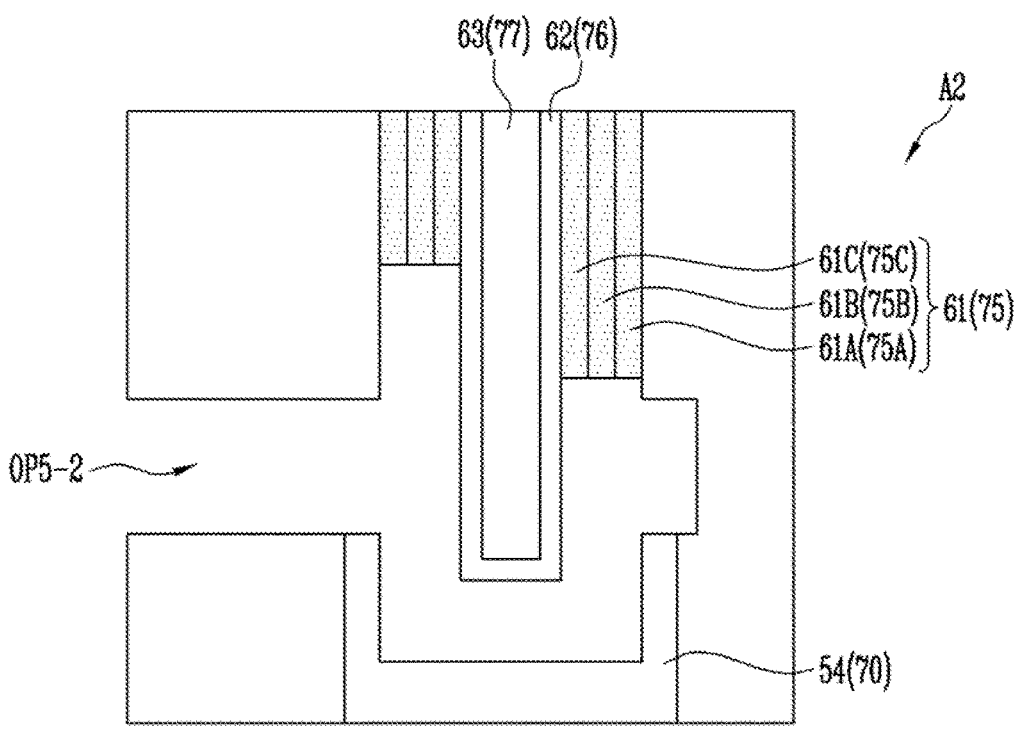
Figure 8D:
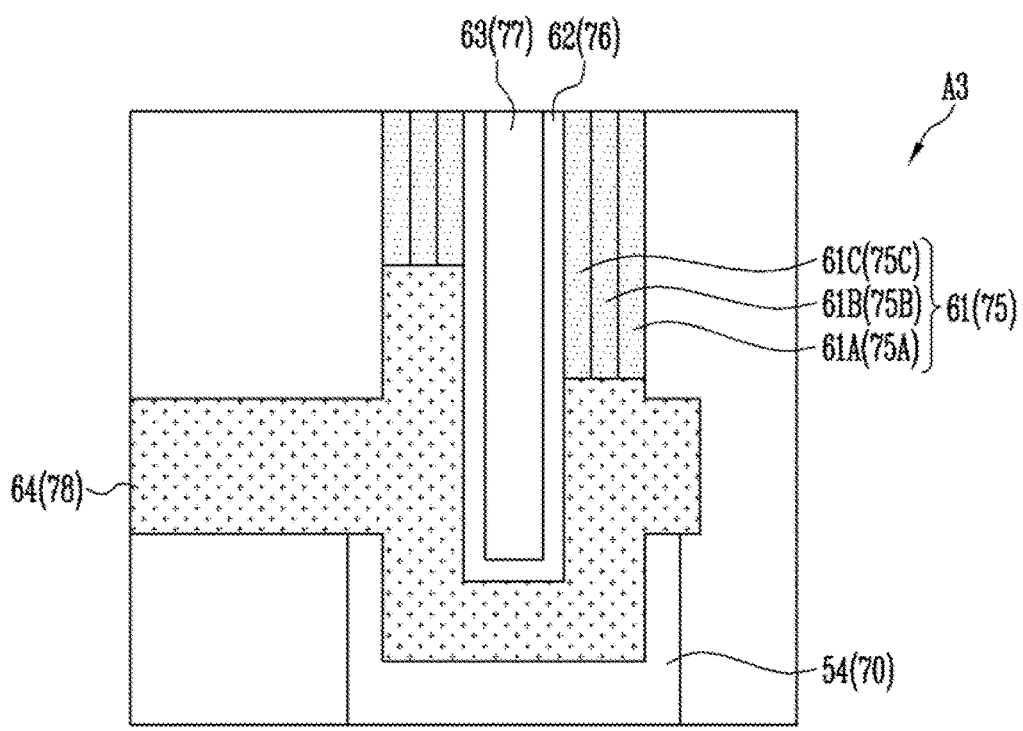

FIGS. 8A to 8D are cross-sectional views illustrating a method of manufacturing a semiconductor device according to an embodiment of the present invention. FIG. 8A is a view enlarging regions A1 shown in FIGS. 5C and 6C. FIGS. 8B and 8C are views enlarging regions A2 of FIGS. 5D and 6D. FIG. 8D is a view enlarging regions A3 of FIGS. 5E and 6E. Hereinafter, a description placing focus on features illustrated by the drawings will be made.

FIGS. 8A to 8D show the embodiments of both FIGS. 5C to 5E and 6C to 6E, where the second opening OP2 passes through the sacrificial pattern 56 (71) and is extended to the underlying semiconductor pattern 54 (the substrate 70). In the embodiment, as described above with reference to FIGS. 7A to 7D, the thickness W1 of the third opening OP3 may be more than twice as much as the sum of thicknesses of the charge blocking layer 61A (75A) and the data storage layer 61B (75B), and less than twice as much as the sum of thicknesses of the charge blocking layer 61A (75A), the data storage layer 61B (75B) and the tunnel insulating layer 61C (75C).

As illustrated in FIGS. 5C, 6C and 8A, the multilayer dielectric layer 61 (75), the semiconductor pattern 62 (76) and the insulating layer 63 (77) may be formed in the second and third openings OP2 and OP3. The charge blocking layer 61A (75A), the data storage layer 61B (75B) and the tunnel insulating layer 61C (75C) may be formed in the third opening OP3.

As illustrated in FIGS. 5D, 6D and 8B, the fourth openings OP4 may be formed by removing the first material layers 51 (73) and the third material layers 59. A portion of the multilayer dielectric layer 61 (75) formed in the third opening OP3 may also be removed. As a result, the 5-$1^{st}$ opening OP5-1 may be formed.

As illustrated in FIGS. 5D, 6D and 8C, part of the charge blocking layer 61A (75A) and the tunnel insulating layer 61C (75C), which are exposed through the 5-$1^{st}$ opening OP5-1, may be removed. For example, in a case where buffer layers are formed in the second openings OP2, the charge blocking layer 61A (75A) and the tunnel insulating layer 61C (75C) may also be removed while the buffer layers exposed through the fourth openings OP4 are removed. As a result, without an additional process, the 5-$2^{nd}$ opening OP5-2 may be naturally formed when the fourth openings OP4 are formed.

As illustrated in FIGS. 5E, 6E and 8D, the coupling pattern 64 (78) may be formed in the 5-$2^{nd}$ opening OP5-2. As a result, the coupling pattern 64 (78) that includes the horizontal portion coupled to the lower portions of the semiconductor patterns 62 (76) and the vertical portions protruding from the horizontal portion and surrounding the sidewalls of the semiconductor patterns 62 (76) may be formed. According to this embodiment, the vertical portion of the coupling pattern 64 (78) may asymmetrically surround the sidewall of the semiconductor pattern 62 (76).

Figure 9A:
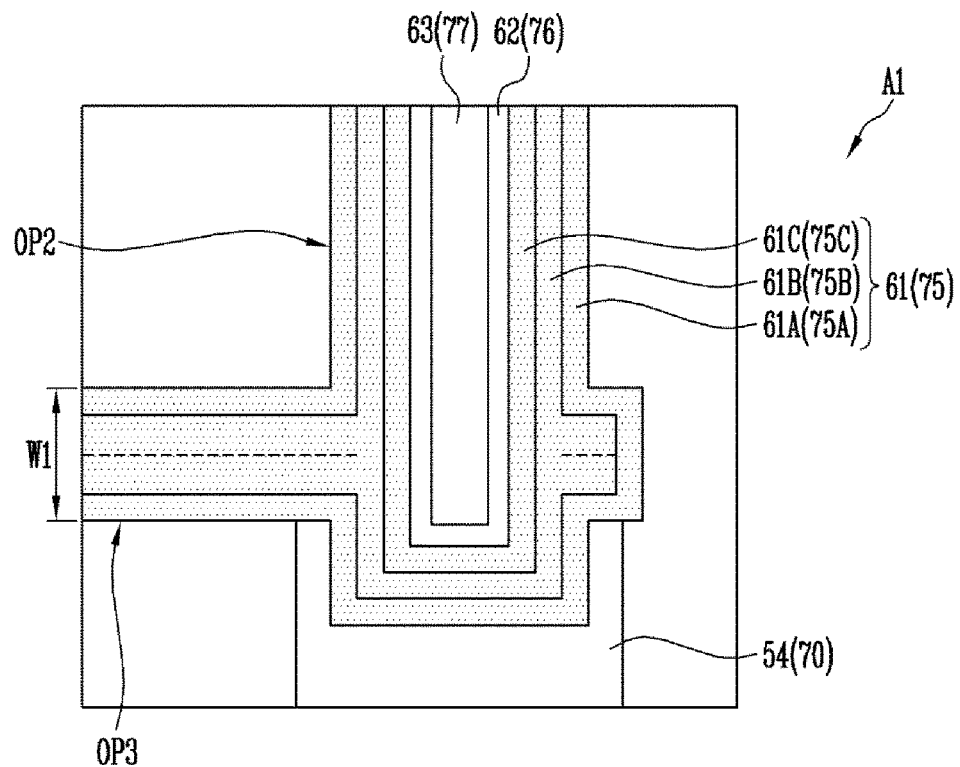
FIGS. 9A to 9D are cross-sectional views illustrating a method of manufacturing a semiconductor device according to an embodiment of the present invention.
Figure 9B:
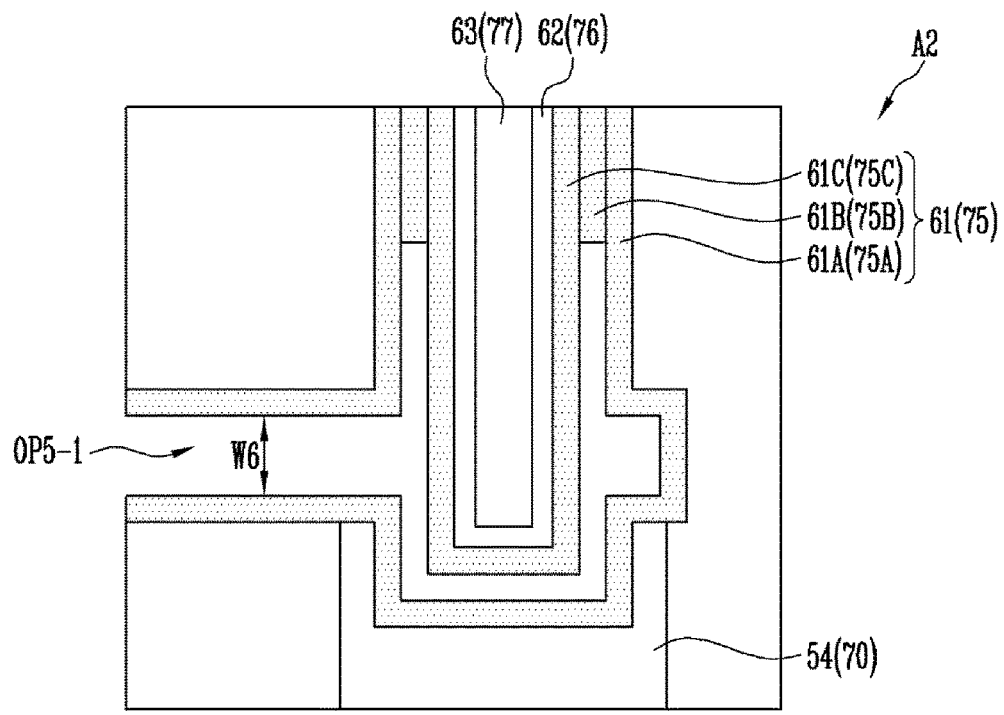
Figure 9C:
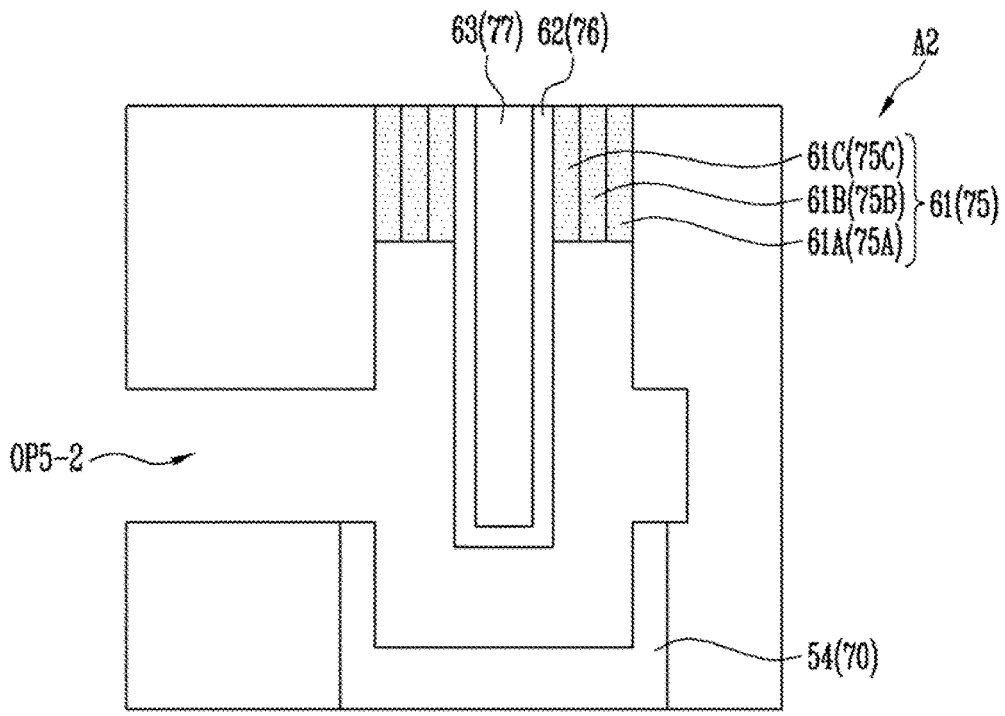
Figure 9D:
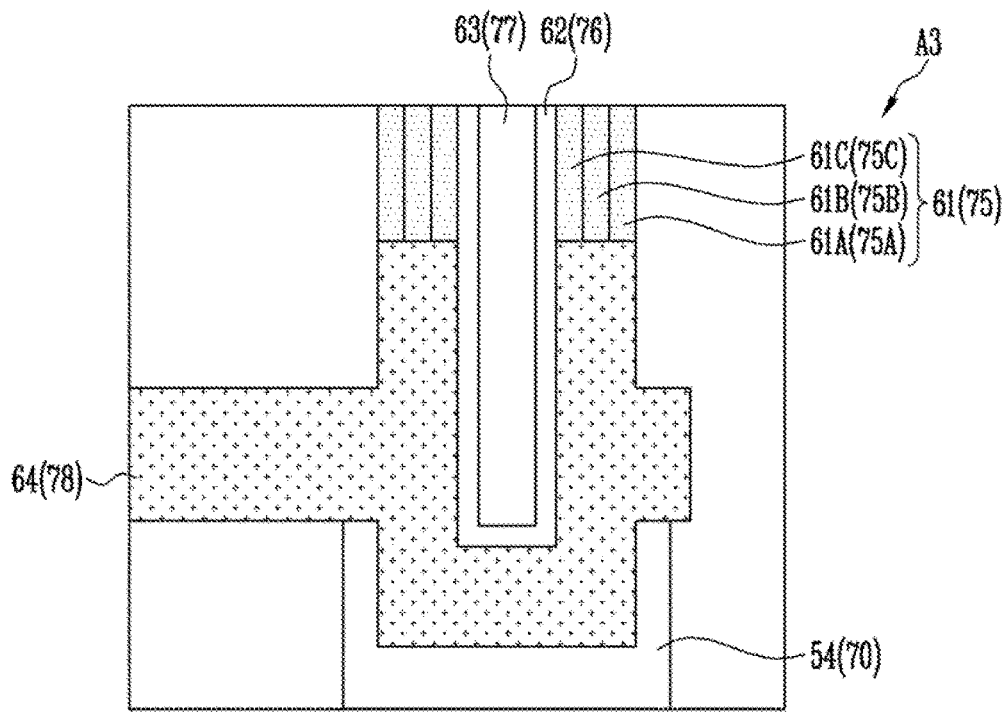

FIGS. 9A to 9D are cross-sectional views illustrating a method of manufacturing a semiconductor device according to an embodiment of the present invention. FIG. 9A is a view enlarging regions A1 shown in FIGS. 5C and 6C. FIGS. 9B and 9C are views enlarging regions A2 of FIGS. 5D and 6D. FIG. 9D is a view enlarging regions A3 of FIGS. 5E and 6E. Hereinafter, a description placing focus on features illustrated by the drawings will be made.

FIGS. 9A to 9D show the embodiments of both FIGS. 5C to 5E and 6C to 6E, where the second opening OP2 passes through the sacrificial pattern 56 (71) and is extended to the underlying semiconductor pattern 54 (the substrate 70), and each of the multilayer dielectric layers 61 (75) include one or more of the charge blocking layer 61A (75A), the data storage layer 61B (75B) and the tunnel insulating layer 61C (75C). In the embodiments, as described above with reference to FIG. 1A, the thickness W1 of the third opening OP3 may be more than twice as much as the thickness of the charge blocking layer 61A (75A) and less than twice as much as the sum of thickness of the charge blocking layer 61A (75A) and the data storage layer 61B (75B).

As illustrated in FIGS. 5C, 6C, and 9A, the multilayer dielectric layer 61 (75), the semiconductor pattern 62 (76) and the insulating layer 63 (77) may be formed in the second and third openings OP2 and OP3. At this time, the charge blocking layer 61A (75A) and the data storage layer 61B (75B) may be formed in the third opening OP3. In other words, in the third opening OP3, the data storage layer 61B (75B) may be formed with a relatively greater thickness without formation of the tunnel insulating layer 61C (75C). The data storage layer 61B (75B) formed in the third opening OP3 may include a seam (dotted line shown in FIG. 9A) therein.

As illustrated in FIGS. 5D, 6D and 9B, the fourth openings OP4 may be formed by removing the first material layers 51 (73) and the third material layers 59. At this time, the data storage layer 61B (75B) formed in the third opening OP3 may also be removed. As a result, the 5-$1^{st}$ opening OP5-1 may be formed. In this embodiment, since the data storage layer 61B (75B) includes the seam therein, the data storage layer 61B (75B) formed in the third opening OP3 may be promptly removed by an etchant flowing along the seam. On the other hand, the data storage layer 61B (75B) formed in the second opening OP2 may be removed relatively slowly. Therefore, the data storage layer 61B (75B) may be removed at a uniform height about the semiconductor pattern 62 (76).

As illustrated in FIGS. 5D, 6D and 9C, part of the charge blocking layer 61A (75A) and the tunnel insulating layer 61C (75C), which are exposed through the 5-$1^{st}$ opening OP5-1, may be removed. For example, in a case where buffer layers are formed in the second openings OP2, the charge blocking layer 61A (75A) and the tunnel insulating layer 61C (75C) may also be removed while the buffer layers exposed through the fourth openings OP4 are removed. Therefore, without an additional process, the 5-$2^{nd}$ opening OP5-2 may be naturally formed when the fourth openings OP4 are formed.

As illustrated in FIGS. 5E, 6E and 9D, the coupling pattern 64 (78) may be formed in the 5-$2^{nd}$ opening OP5-2. As a result, the coupling pattern 64 (78) that includes the horizontal portion coupled to the lower portions of the semiconductor patterns 62 (76) and the vertical portions protruding from the horizontal portion and surrounding the sidewalls of the semiconductor patterns 62 (76) may be formed. According to this embodiment, the vertical portion of the coupling pattern 64 (78) may symmetrically surround the sidewall of the semiconductor pattern 62 (76).

FIGS. 10A to 10D are cross-sectional views illustrating a method of manufacturing a semiconductor device according to an embodiment of the present invention. For example, FIGS. 10A to 10D show a method of manufacturing semiconductor patterns 54, 62 and 76 including semiconductor layers 54A, 62A and 76A, and semiconductor plugs 54B, 62B and 76B described above with reference to FIGS. 5A to 6E.

Figure 10A:
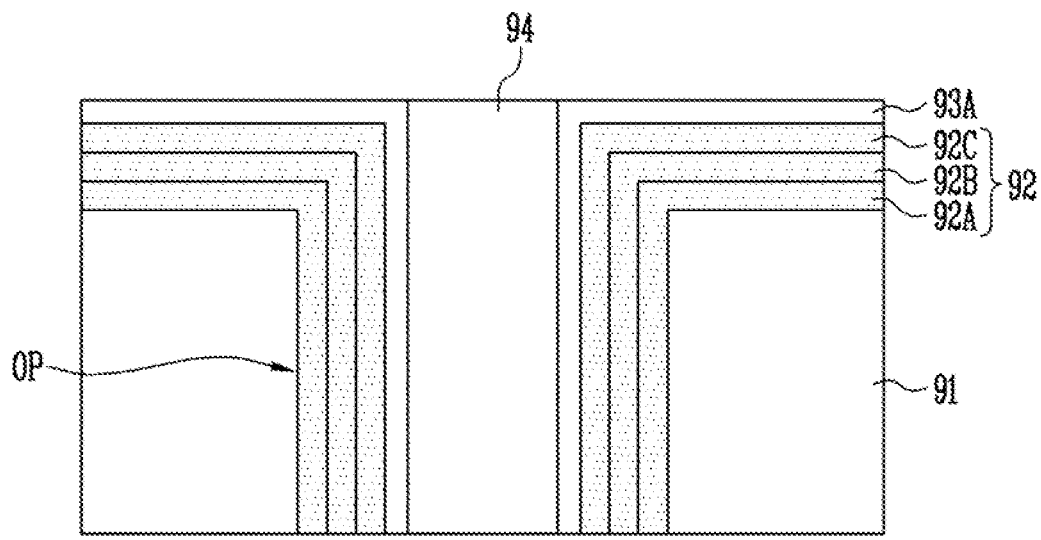
FIGS. 10A to 10D are cross-sectional views illustrating a method of manufacturing a semiconductor device according to an embodiment of the present invention.

As illustrated in FIG. 10A, an opening OP may be formed through a stacked structure 91, and a multilayer dielectric layer 92 may be formed along an inner surface of the opening OP. The multilayer dielectric layer 92 may include a charge blocking layer 92A, a data storage layer 92B and a tunnel insulating layer 92C. Subsequently, a semiconductor layer 93A may be formed on the multilayer dielectric layer 92, and an insulating layer 94 may be formed in the opening OP.

Figure 10B:
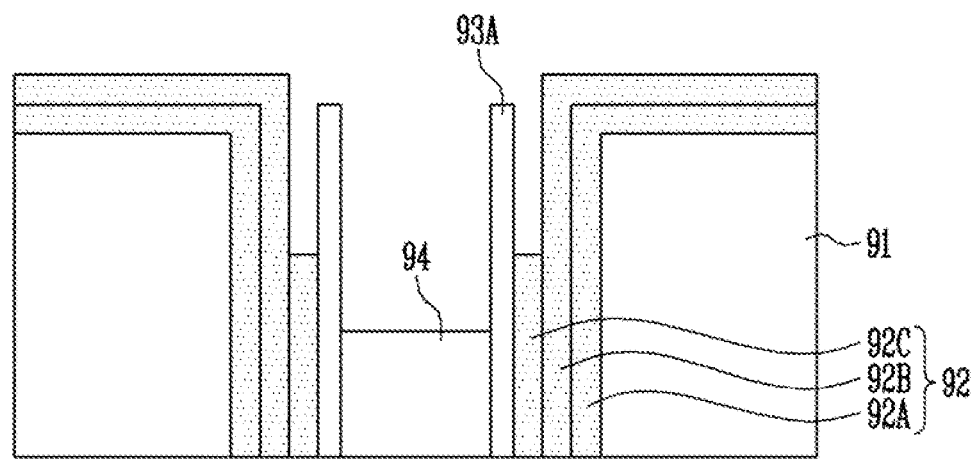

As illustrated in FIG. 10B, the insulating layer 94 may be etched to a predetermined depth. The tunnel insulating layer 92C formed on the top of the multilayer dielectric layer 92 may also be etched. However, the insulating layer 94 and the tunnel insulating layer 92C may be etched to different depths depending on an etch selectivity therebetween. For example, the insulating layer 94 may be etched to a greater depth than the tunnel insulating layer 92C. As a result, a portion of the data storage layer 92B may be exposed.

Figure 10C:
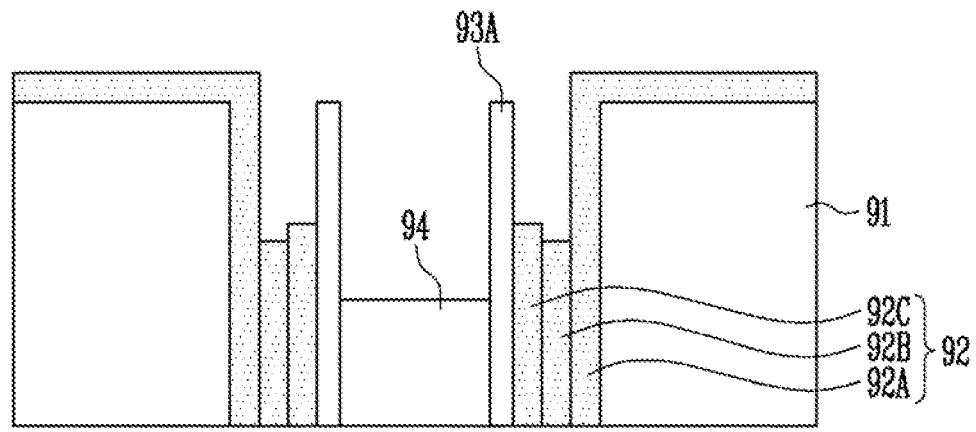

As illustrated in FIG. 10C, the exposed portion of the data storage layer 92B may be selectively etched. The exposed portion of the data storage layer 92B may be etched so that a top surface of the data storage layer 92B and a top surface of the tunnel insulating layer 92C may have different heights. For example, the exposed portion of the data storage layer 92B may be etched so that the top surface of the data storage layer 92B may be lower or higher than the tunnel insulating layer 92C. In this example, top surfaces of the insulating layer 94, the semiconductor layer 93A, the tunnel insulating layer 92C, the data storage layer 92B and the charge blocking layer 92A may be stepped, and the semiconductor layer 93A may protrude the most.

Figure 10D:
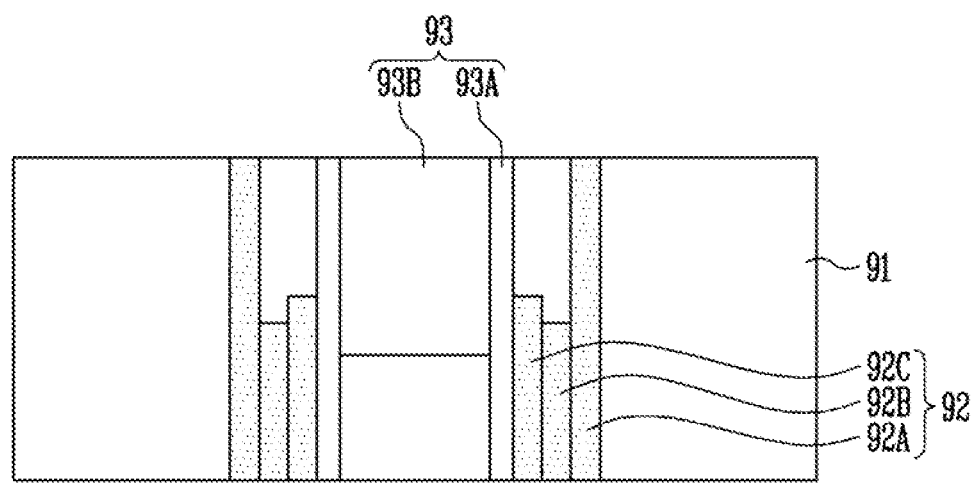

As illustrated in FIG. 10D, after a semiconductor layer is formed over the entire intermediate resultant structure, the semiconductor layer may be planarized until a top surface of the stacked structure 91 is exposed, so that a semiconductor plug 93B may be formed. As a result, a semiconductor pattern 94 that includes the insulating layer 94 passing through the stacked structure 91, the semiconductor plug 93B formed over the insulating layer 94, and the semiconductor layer 93A surrounding a sidewall of the insulating layer 94 and passing through the semiconductor plug 93B may be formed.

The above-described processes may be applied to form the earlier-described semiconductor plugs 54B, 62B and 76B. As described above, after the multilayer dielectric layer 92 is etched in stages, the semiconductor plug 93B may be formed. Therefore, it may be easier to form the semiconductor plug 93B. In addition, when the coupling pattern and the semiconductor pattern are formed over the semiconductor plug 93B, the semiconductor plug 93B may function as an etch stop layer to prevent neighboring layers from being damaged.

Figure 11:
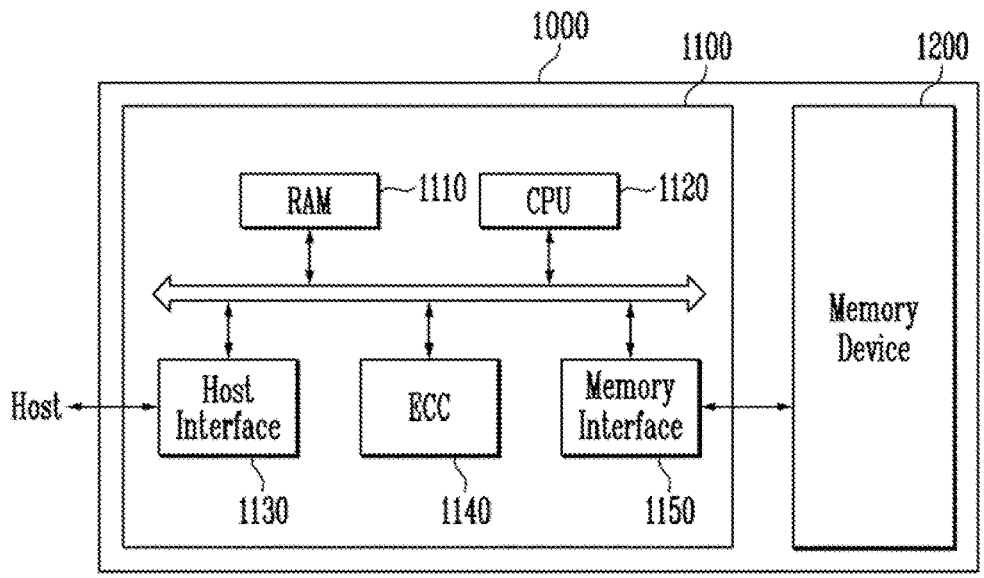
FIG. 11 is a block diagram illustrating a memory system according to an embodiment of the present invention.

FIG. 11 is a block diagram illustrating a memory system according to an embodiment of the present invention.

As illustrated in FIG. 11, a memory system 1000 according to an embodiment of the present invention may include a memory device 1200 and a controller 1100.

The memory device 1200 may be used to store various data types such as text, graphic and software code. The memory device 1200 may be a non-volatile memory and include the memory string described above with reference to FIGS. 1A to 10D. The memory device 1200 may include a first stacked structure including first conductive layers and first insulating layers formed alternately with each other, first semiconductor patterns passing through the first stacked structure, a coupling pattern coupled to the first semiconductor patterns, and a slit passing through the first stacked structure and the coupling pattern. Since the memory device 1200 is formed and manufactured in the above-described manner, a detailed description thereof will be omitted.

The controller 1100 may be coupled to a host and the memory device 1200, and may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced by a static random access memory (SRAM) or a read only memory (ROM).

The host interface 1130 may interface with the host. For example, the controller 1100 may communicate with the host through one of various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol and a private protocol.

The ECC circuit 1140 may detect and correct errors included in data read from the memory device 1200 by using error correction codes (ECCs).

The memory interface 1150 may interface with the memory device 1200. For example, the memory interface 1150 may include a NAND interface or a NOR interface.

For example, the controller 1100 may further include a buffer memory (not illustrated) configured to temporarily store data. The buffer memory may temporarily store data externally transferred through the host interface 1130, or temporarily store data transferred from the memory device 1200 through the memory interface 1150. The controller 1100 may further include ROM storing code data to interface with the host.

Since the memory system 1000 according to an embodiment of the present invention includes the memory device 1200 having improved characteristics of, for example improved cell current characteristics, characteristics of the overall memory system 1000 may be improved.

Figure 12:
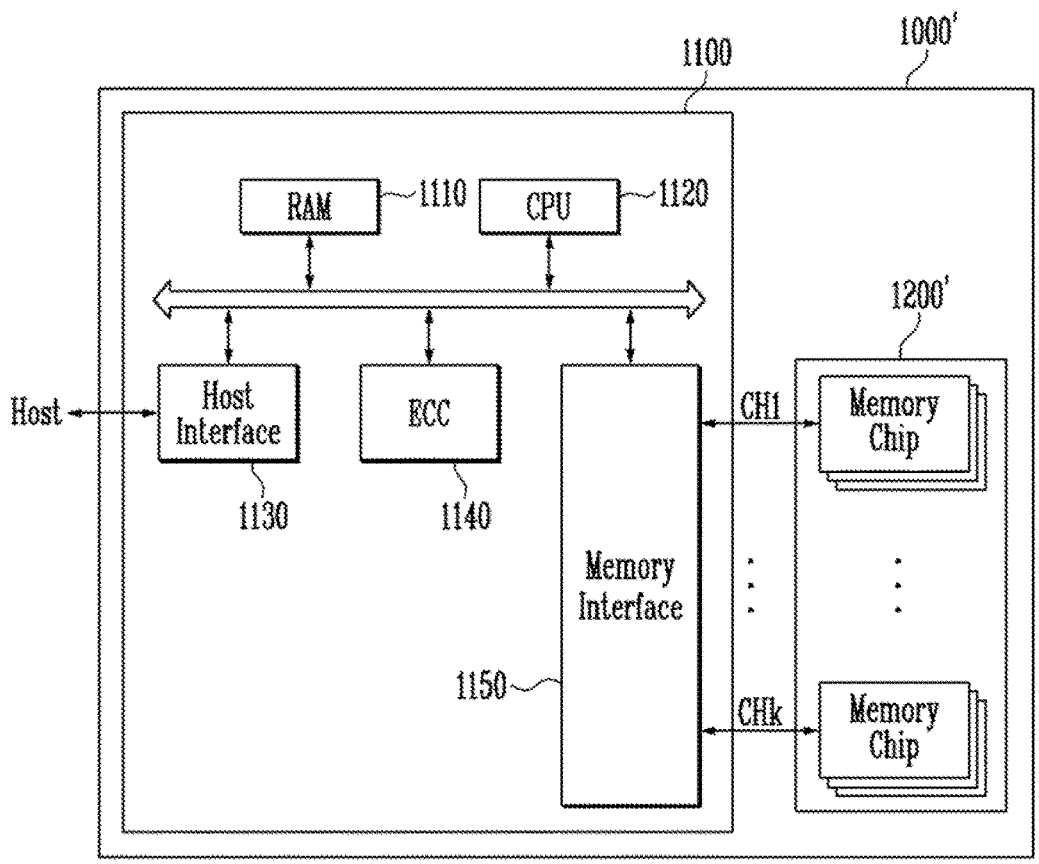
FIG. 12 is a block diagram illustrating a memory system according to an embodiment of the present invention.

FIG. 12 is a block diagram illustrating a memory system according to an embodiment of the present invention. Hereinafter, a description of common contents with the earlier described embodiment is omitted.

As illustrated in FIG. 12, a memory system 1000' according to an embodiment of the present invention may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. The memory device 1200' may be the semiconductor device described above with reference to FIGS. 1A to 10D. The memory device 1200' may include a first stacked structure including first conductive layers and first insulating layers formed alternately with each other, first semiconductor patterns passing through the first stacked structure, a coupling pattern coupled to the first semiconductor patterns, and a slit passing through the first stacked structure and the coupling pattern. Since the memory device 1200' is formed and manufactured in the above-described manufacturing method, a detailed description thereof will be omitted.

The memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips, included in a single group, may be suitable for communicating with the controller 1100 through a common channel. The memory system 1000' may be modified so that a single memory chip may be coupled to a single channel.

As described above, according to an embodiment of the present invention, since the memory system 1000' includes the memory device 1200' having improved characteristics of, improved cell current characteristics for example, characteristics of the overall memory system 1000' may also be improved. In addition, data storage capacity and driving speed of the memory system 1000' may be further increased by forming the memory device 1200' using a multi-chip package.

Figures 13, 14:
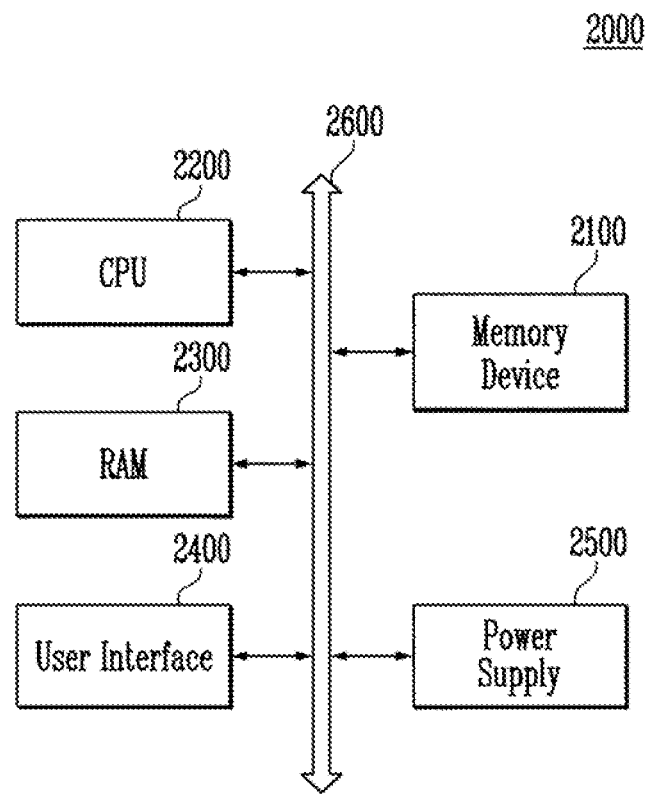
FIG. 13 is a block diagram illustrating a computing system according to an embodiment of the present invention.
FIG. 14 is a block diagram illustrating a computing system according to an embodiment of the present invention.

FIG. 13 is a block diagram illustrating a computing system according to an exemplary embodiment of the present invention. Hereinafter, a description of common contents with the earlier described embodiments is omitted.

As illustrated in FIG. 13, a computing system 2000 according to an embodiment of the present invention may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. The memory device 2100 may be electrically coupled to the CPU 2200, the RAM 2300, the user interface 2400 and the power supply 2500. For example, the memory device 2100 may be coupled to the system bus 2600 through a controller (not illustrated) or be directly coupled to the system bus 2600. When the memory device 2100 is directly coupled to the system bus 2600, functions of the controller may be performed by the CPU 2200 and the RAM 2300.

The memory device 2100 may be non-volatile memory. The memory device 2100 may be the semiconductor memory device described above with reference to FIGS. 1A to 10D. The memory device 2100 may include a first stacked structure including first conductive layers and first insulating layers formed alternately with each other, first semiconductor patterns passing through the first stacked structure, a coupling pattern coupled to the first semiconductor patterns, and a slit passing through the first stacked structure and the coupling pattern. Since the memory device 2100 is formed and manufactured in the above-described manner, a detailed description thereof will be omitted.

In addition, as described above with reference to FIG. 12, the memory device 2100 may be a multi-chip package composed of a plurality of memory chips.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environment, one of various electronic devices for home network, one of various electronic devices for computer network, one of various electronic devices for telematics network, an RFID device, and/or one of various devices for computing systems, etc.

As described above, since the computing system 2000 according to an embodiment of the present invention includes the memory device 2100 having improved characteristics of, for example, cell current, characteristics of the computing system 2000 as a whole may be increased.

FIG. 14 is a block diagram illustrating a computing system according to an embodiment of the present invention.

As illustrated in FIG. 14, a computing system 3000 according to an embodiment of the present invention may include a software layer that has an operating system 3200, an application 3100, a file system 3300 and a translation layer 3400. The computing system 3000 may include a hardware layer such as a memory system 3500.

The operating system 3200 manages software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

FIG. 14 illustrates the operating system 3200, the application 3100, and the file system 3300 in separate blocks. However, the application 3100 and the file system 3300 may be included in the operating system 3200.

The translation layer 3400 may translate an address suitable for the memory device 3500 in response to a request from the file system 3300. For example, the translation layer 3400 may translate a logic address, generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL) or the like.

The memory device 3500 may be a non-volatile memory. The memory device 3500 may be the semiconductor memory device described above with reference to FIGS. 1A to 10D. The memory device 3500 may include a first stacked structure including first conductive layers and first insulating layers formed alternately with each other, first semiconductor patterns passing through the first stacked structure, a coupling pattern coupled to the first semiconductor patterns, and a slit passing through the first stacked structure and the coupling pattern. Since the memory device 3500 is formed and manufactured in the above-described manner, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer and driven by an operation memory. The translation layer 3400 may be included in the operating system layer or the controller layer.

As described above, since the computing system 3000 according to an embodiment of the present invention includes the memory device 3500 having improved characteristics, cell current, for example, characteristics of the entire computing system 3000 may be improved.

A semiconductor device may include a coupling pattern surrounding lower portions of semiconductor patterns. Since the coupling pattern is formed in a region from which a multilayer dielectric layer is removed, the coupling pattern may be easily formed without causing damage to the multilayer dielectric layer in a memory cell region. Accordingly, degradation of operating characteristics of memory cells may be prevented, and degradation of cell current may be prevented by solving interface issues.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
   a first stacked structure including first conductive layers and first insulating layers formed alternately with each other;
   a second stacked structure located under the first stacked structure and including second conductive layers and second insulating layers formed alternately with each other;
   first semiconductor patterns passing through the first stacked structure;
   coupling patterns coupled to the first semiconductor patterns, respectively;
   second semiconductor patterns passing through the second stacked structure and coupled to the first semiconductor patterns through the coupling patterns; and
   a slit located between neighboring first semiconductor patterns, wherein the slit passes through the first stacked structure and the coupling patterns so that sidewalls of the coupling patterns are defined by the slit.

2. The semiconductor device of claim 1, wherein each of the coupling patterns comprises:
   a horizontal portion coupled to lower portions of the first semiconductor patterns; and
   vertical portions protruding from the horizontal portion and surrounding sidewalls of the first semiconductor patterns.

3. The semiconductor device of claim 2, wherein each of the vertical portions surrounds each of the first semiconductor patterns at a uniform height.

4. The semiconductor device of claim 2, further comprising multilayer dielectric layers surrounding the sidewalls of the first semiconductor patterns and having substantially the same thickness as the vertical portions.

5. The semiconductor device of claim 1, wherein the coupling patterns are substantially conductive.

6. The semiconductor device of claim 1, further comprising a protective layer contacting a top surface of each of the coupling patterns and including a different material from the coupling pattern.

7. The semiconductor device of claim 1, further comprising multilayer dielectric layers surrounding sidewalls of the first semiconductor patterns.

8. The semiconductor device of claim 7, wherein a thickness of each of the coupling patterns is less than twice the thickness of the multilayer dielectric layer.

9. The semiconductor device of claim 7, wherein each of the multilayer dielectric layers includes a tunnel insulating layer, a data storage layer and a charge blocking layer.

10. The semiconductor device of claim 9, wherein a thickness of each of the coupling patterns is more than twice as much as a sum of thicknesses of the charge blocking layer and the data storage layer, and less than twice as much as a sum of thicknesses of the charge blocking layer, the data storage layer and the tunnel insulating layer.

11. The semiconductor device of claim 9, wherein a thickness of each of the coupling patterns is more than twice as much as a thickness of the charge blocking layer and less than twice as much as a sum of thicknesses of the charge blocking layer and the data storage layer.

12. The semiconductor device of claim 9, wherein top surfaces of the tunnel insulating layer, the data storage layer and the charge blocking layer have different heights, and
wherein each of the first semiconductor patterns includes:
an insulating layer passing through the first stacked structure;
a semiconductor plug formed on the insulating layer; and
a semiconductor layer surrounding a sidewall of the insulating layer and passing through the semiconductor plug.

13. The semiconductor device of claim 1, further comprising a peripheral circuit located under the first stacked structure.

14. The semiconductor device of claim 1, wherein the first semiconductor patterns, the coupling patterns and the second semiconductor patterns are channel layers.

15. The semiconductor device of claim 1, further comprising:
a third semiconductor pattern coupling at least two of the second semiconductor patterns; and
a third conductive layer surrounding the third semiconductor pattern.

16. The semiconductor device of claim 1, wherein each of the second semiconductor patterns includes a groove formed in a top surface thereof, and
wherein the groove is filled with the coupling pattern.

17. The semiconductor device of claim 1,
wherein each of the coupling patterns is a first source layer.

18. The semiconductor device of claim 17, further comprising:
a third insulating layer surrounding the coupling pattern; and
a substrate located under the third insulating layer and contacting a bottom surface of the coupling pattern.

19. The semiconductor device of claim 18, wherein the substrate includes a groove formed in a top surface thereof, and
wherein the groove is filled with the coupling pattern.

20. The semiconductor device of claim 17, further comprising:
a second source layer surrounding the first source layer and including polysilicon;
a third insulating layer located under the second source layer; and
a substrate located under the third insulating layer.

21. The semiconductor device of claim 20, further comprising a third source layer interposed between the second source layer and the third insulating layer, and including a metal layer.

22. The semiconductor device of claim 21, further comprising a fourth source layer interposed between the third source layer and the third insulating layer, and including polysilicon.

23. The semiconductor device of claim 17, further comprising:
a peripheral circuit located under the first stacked structure;
a first contact plug coupling the peripheral circuit and the first semiconductor patterns to each other; and
a second contact plug coupling the peripheral circuit and the first source layer to each other.

24. A semiconductor device, comprising:
a first stacked structure including first conductive layers and first insulating layers formed alternately with each other;
first semiconductor patterns passing through the first stacked structure;
coupling patterns including horizontal portions coupled to lower portions of the first semiconductor patterns and vertical portions protruding from the horizontal portions and surrounding sidewalls of the first semiconductor patterns; and
a slit passing through the first stacked structure and the coupling patterns,
wherein each of the vertical portions surrounds each of the first semiconductor patterns at a non-uniform height.

25. A semiconductor device, comprising:
a first stacked structure including first gate electrodes and first insulating layers formed alternately with each other;
a second stacked structure located under the first stacked structure, and including second gate electrodes and second insulating layers formed alternately with each other;
first channel layers passing through the first stacked structure;
multilayer dielectric layers surrounding sidewalls of the first channel layers, respectively;
second channel layers passing through the second stacked structure;
coupling patterns, each coupling pattern including a horizontal portion coupled to a lower portion of each of the first channel layers and an upper portion of each of the second channel layers and a vertical portion protruding from the horizontal portion and surrounding a sidewall of each of the first channel layers, wherein the vertical portion has substantially the same thickness as each of the multilayer dielectric layers; and
a slit located between neighboring first semiconductor patterns and between neighboring second semiconductor patterns, and passing through the first stacked structure, the second stacked structure and the horizontal portion of the coupling pattern.

26. The semiconductor device of claim 25, further comprising a tunnel insulating layer, a data storage layer and a charge blocking layer surrounding each of the second channel layers, wherein heights of top surfaces of the tunnel insulating layer, the data storage layer and the charge blocking layer are different,
wherein each of the second channel layers includes:
an insulating layer passing through the second stacked structure;
a semiconductor plug formed on the insulating layer; and
a semiconductor layer surrounding a sidewall of the insulating layer and passing through the semiconductor plug.

27. A semiconductor device, comprising:
a first stacked structure including first conductive layers and first insulating layers formed alternately with each other;
a second stacked structure located under the first stacked structure, and including second conductive layers and second insulating layers formed alternately with each other;
first channel layers passing through the first stacked structure;

second channel layers passing through the second stacked structure;

third insulating layer interposed between the first stacked structure and the second stacked structure, wherein a lower surface of the third insulating layer contacts an uppermost second insulating layer and an upper surface of the third insulating layer contacts a lowermost first insulating layer; and coupling patterns located in the third insulating layer, each of the coupling patterns including a horizontal portion coupling each of the first channel layers to each of the second channel layers and a vertical portion protruding from the horizontal portion and surrounding a sidewall of each of the first channel layers.

28. The semiconductor device of claim 27, wherein the third insulating layer is located at substantially the same level as the coupling pattern.

29. The semiconductor device of claim 27, wherein the third insulating layer has substantially the same thickness as the coupling pattern.

30. The semiconductor device of claim 27, wherein the third insulating layer surrounds sidewalls of the coupling patterns.

31. The semiconductor device of claim 27, wherein a first interface exists between the lower surface of the third insulating layer and an upper surface of the uppermost second insulating layer and a second interface exists between an upper surface of the third insulating layer and a lower surface of the lowermost first insulating layer.

32. The semiconductor device of claim 27, wherein the first conductive layers include polysilicon and the second conductive layers includes polysilicon.

33. The semiconductor device of claim 27, further comprising:

first data storage layers interposed between the first channel layers and the first conductive layers, wherein each of the first data storage layers is a polysilicon layer; and second data storage layers interposed between the second channel layers and the second conductive layers, wherein each of the second data storage layers is a polysilicon layer.

34. The semiconductor device of claim 27, wherein each of the coupling patterns includes polysilicon or a silicide material.

35. A semiconductor device, comprising:

a first stacked structure including first polysilicon layers and first insulating layers formed alternately with each other;

a second stacked structure located under the first stacked structure, and including second polysilicon layers and second insulating layers formed alternately with each other;

first channel layers passing through the first stacked structure;

first data storage layers interposed between the first channel layers and the first polysilicon layers and including polysilicon layers;

second channel layers passing through the second stacked structure;

second data storage layers interposed between the second channel layers and the second polysilicon layers and including polysilicon layers;

third insulating layer interposed between the first stacked structure and the second stacked structure, wherein a lower surface of the third insulating layer contacts an uppermost second insulating layer and an upper surface of the third insulating layer contacts a lowermost first insulating layer;

coupling patterns located in the third insulating layer, each of the coupling patterns including a horizontal portion coupling each of the first channel layers to each of the second channel layers and a vertical portion protruding from the horizontal portion and surrounding a sidewall of each of the first channel layers.

\* \* \* \* \*